(12) United States Patent
Ogawa

(10) Patent No.: US 6,246,265 B1
(45) Date of Patent: Jun. 12, 2001

(54) SEMICONDUCTOR INTEGRATED LOGIC CIRCUIT WITH SEQUENTIAL CIRCUITS CAPABLE OF PREVENTING SUBTHRESHOLD LEAKAGE CURRENT

(75) Inventor: Tadahiko Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/330,161

(22) Filed: Jun. 11, 1999

(30) Foreign Application Priority Data

Jun. 12, 1998 (JP) .................................................. 10-165170

(51) Int. Cl.$^7$ ................................................. A03K 19/096
(52) U.S. Cl. .............................. 326/95; 326/83; 326/113
(58) Field of Search ................................. 326/40, 83, 86, 326/95, 113, 93, 14

(56) References Cited

U.S. PATENT DOCUMENTS

| | | | |
|---|---|---|---|
| 4,691,189 | * | 9/1987 | Dingwall et al. ....................... 326/92 |
| 5,525,921 | * | 6/1996 | Callahan ............................... 327/202 |
| 5,552,738 | * | 9/1996 | Ko ........................................ 327/203 |
| 5,821,769 | | 10/1998 | Douseki ................................ 326/34 |

FOREIGN PATENT DOCUMENTS

| | | |
|---|---|---|
| 0 768 762 A1 | 4/1997 | (EP) . |
| 5-54693 | 3/1993 | (JP) . |
| 5-122020 | 5/1993 | (JP) . |
| 5-122021 | 5/1993 | (JP) . |
| 7-202647 | 8/1995 | (JP) . |
| 2631335 | 4/1997 | (JP) . |
| 9-121152 | 5/1997 | (JP) . |
| 9-274797 | 10/1997 | (JP) . |

OTHER PUBLICATIONS

Patent Abstracts of Japan vol. 017, No. 487 (E–1427), Sep. 3, 1993 & JP 05 122020 A (Nippon Telegr & Teleph Corp), May 18, 1993.

* cited by examiner

*Primary Examiner*—Michael Tokar
*Assistant Examiner*—Don Pau Le
(74) *Attorney, Agent, or Firm*—Sughrue, Mion, Zinn, Macpeak & Seas, PLLC

(57) ABSTRACT

A semiconductor integrated logic circuit device with a sequential circuit includes a transferring section, an inverting section, a bistable circuit section, and a blocking section. The transferring section is provided between first and second nodes, and transfers a data signal from the first node to the second node in response to a clock signal. The inverting section is provided between the second node and a third node, and inverts the data signal on the second node to output on the third node as an inverted data signal. The bistable circuit section is connected to the second and third nodes, and holds the data signal. The blocking section is provided between the bistable circuit and the first node, and blocks off sub-threshold leakage current.

43 Claims, 21 Drawing Sheets

SEMICONDUCTOR INTEGRATED LOGIC CIRCUIT WITH SEQUENTIAL CIRCUITS CAPABLE OF PREVENTING SUBTHRESHOLD LEAKAGE CURRENT

BACKGROUND OF THE INVENTION

1. Field of the Invention

The present invention relates to a semiconductor integrated logic circuit with sequential circuits which has an information holding function in a sleep mode.

2. Description of the Related Art

Conventionally, in a semiconductor integrated logic circuit, a system having a transistor circuit structure is adopted to satisfy a high speed operation in an active mode and low power consumption in a sleep mode. Especially, the semiconductor integrated logic circuit has an information holding function such that a memory data of the sequential circuit is not destroyed at the time of the sleep mode.

For example, the following technique is disclosed in the Japanese Patent No. 2,631,335 (Japanese Laid Open Patent Application (JP-A-Heisei 06-029834). That is, in a semiconductor integrated logic circuit can operate at high speed, the power is supplied through a higher threshold type transistor to block off a leakage current at the time of the sleep mode. Also, a bistable circuit composed of higher threshold type transistors is added to the sequential circuit and the power is directly supplied to the higher threshold type transistors. Thus, the blocking-off of a leakage current and the avoidance from destruction of the memory data at the time of the sleep mode is attained.

FIG. 1 is a circuit diagram which shows a conventional example of the semiconductor integrated logic circuit with sequential circuits, which has an information holding function at the time of the sleep mode.

As shown in FIG. 1, a control transistor HP1I which is composed of a p-channel type MOSFET with a high threshold value. The control transistor HP1I is connected with a higher potential side actual power supply line VDD at the source electrode and a higher potential side quasi power supply line VDDV at the drain electrode. Thus, the electric connection between the higher potential side actual power supply line and the higher potential side quasi power supply line is set to the conductive state or the blocking-off state in response to a sleep mode switching signal SL which is applied to the gate electrode. Also, a control transistor HN1I which is composed of an n-channel type MOSFET with a high threshold value. The control transistor HN1I is connected with a lower potential side actual power supply voltage GND at the source electrode and a lower potential side quasi power supply voltage GNDV at the drain electrode. Thus, the electric connection between the lower potential side actual power supply line and the lower potential side quasi power supply line is set to the conductive state or the blocking-off state in response to an inverted sleep mode switching signal SLB which is applied to the gate electrode. In this case, the inverted sleep mode switching signal SLB is the signal which is obtained by inverting the sleep mode switching signal SL, and is sent out from a sleep mode control circuit which is not illustrated.

A CMOS circuit group which is composed of the inverter circuits INV1I and INV2I which are composed of lower threshold type transistors. The inverter circuits INV1I and INV2I performs the buffering operation of data signals D1B and D2B which are supplied to the latch circuits 10A and 10B, respectively. The inverter circuit INV1I is composed of an n-channel type MOSFET as a lower threshold value transistor and a p-channel type MOSFET as a lower threshold value transistor. The gate electrodes of the respective transistors are connected in common and the data signal D1B is supplied thereto. The drain electrodes of the respective transistors are connected in common and function as an input terminal of the latch circuit 10A. The inverter circuit INV2I is composed of an n-channel type MOSFET as a lower threshold type transistor and a p-channel type MOSFET as a lower threshold type transistor. The gate electrodes of the respective transistors are connected in common and data signal D2B is supplied thereto. The drain electrodes of the respective transistors are connected in common and function as an input terminal to the latch circuit 10B.

Also, the source electrode of the p-channel type MOSFET with the lower threshold value in the inverter circuit INV1I is connected with the higher potential side quasi power supply line VDDV which supplies a higher potential side the quasi power supply voltage through the drain electrode of the control transistor HP1I. Also, the source electrode of the n-channel type MOSFET with the lower threshold value in the inverter circuit INV1I is connected with the lower potential side quasi power supply line GNDV which supplies a lower potential side quasi power supply voltage through the drain electrode of the control transistor HN1I.

Moreover, the structures of the latch circuits 10A and 10B of the sequential circuits have the information holding function at the time of the sleep mode in FIG. 1. The latch circuits 10A and 10B will be described.

The latch circuit 10A is composed of the transfer gates TM1A and TM2A and three inverter circuits INV1A, INV2A and INV3A. The transfer gate TM1A is composed of a n-channel type MOSFET as a lower threshold type transistor and a p-channel type MOSFET as a lower threshold type transistor. The source electrode of one of the transistors and the drain electrode of the other of the transistors are connected in parallel in an alternate manner. One of the electrodes of the transfer gate TM1A is connected with an output terminal of the inverter circuit INV1I and the other electrode thereof is connected with the input terminal of the inverter circuit INV1A.

Moreover, a clock signal φ is applied to the gate electrode of the n-channel type MOSFET as the lower threshold type transistor in the transfer gate TM1A. An inverted clock signal *φ which is the inverted signal of the clock signal φ is applied to the gate electrode of the p-channel type MOSFET as the lower threshold type transistor.

The transfer gate TM2A and the transfer gate TM1A have the same structure and are bidirectional. One of the electrodes of the transfer gate TM2A is connected with the input terminal of the inverter circuit INV1A and the other electrode thereof is connected with the ago output of the inverter circuit INV2A. It should be noted that the transistors of the transfer gate TM2A may be lower threshold type MOSFETs or high threshold type MOSFETs.

The inverter circuits INV1A, INV2A and INV3A have the same structure as those of the inverter circuits INV1I and INV2I, and each of transistors of the inverter circuit INV1A is an MOSFET with the lower threshold value. Each of the transistors of the inverter circuits INV2A and INV3A is an MOSFET with the high threshold value.

Also, the control transistor HP1A which is composed of a p-channel type MOSFET with the high threshold value sets the electric connection with the drain electrode to the conductive state or the blocking-off state in response to the mode switching signal SL. Also, the control transistor HN1A which is composed of an n-channel type MOSFET with the high threshold value, is connected with the lower potential side actual power supply voltage GND at the source electrode. The control transistor HN1A sets the electric connection with the drain electrode to the conductive state or the blocking-off state in response to the inverted sleep mode switching signal SLB applied to the gate electrode thereof.

Also, the source electrode of the p-channel type MOSFET with the lower threshold value in the inverter circuit INV1A is connected with the drain electrode of the control transistor HP1A. The source electrode of the n-channel type MOSFET with the lower threshold value in the inverter circuit INV1A is connected with the drain electrode of the control transistor HN1A. Also, the inverter circuit INV3A is connected with the inverter circuit INV1A in parallel. The inverter circuit INV3A is different from the inverter circuit INV1A in that the inverter circuit INV3A is directly supplied with a power supply voltage from the higher potential side actual power supply line VDD and the lower potential side actual power supply line GND. The power supply voltage does not pass through the control transistor such as the control transistor HP1A as the p-channel type MOSFET with the high threshold value and the control transistor HN1A as the n-channel type MOSFET with the high threshold value.

The output terminals of the inverter circuits INV1A and inverter circuit INV3A are connected in common and functions as the output terminal of the latch circuits 10A to send out the latch output signal Q1B to the subsequent stage of the circuit. Also, the output terminals of the inverter circuits INV1A and INV3A which are connected in common are connected with the input terminal of the inverter circuit INV2A. Also, the inverter circuit INV2A is composed of two MOSFETs as the higher threshold type transistors, like the inverter circuit INV3A. Moreover, the inverter circuit INV2A is directly supplied with the power supply voltage from the higher potential side actual power supply line VDD and the lower potential side actual power supply line GND.

Next, the operation of the latch circuit 10A shown in FIG. 1 as the sequential circuit which has the information holding function at the time of the sleep mode will be described.

The data signal D1B is inverted by the inverter circuit INV1I. Thus, the data signal supplied to the latch circuits 10A is taken in by the transfer gate TM1A at the timing of the clock signal φ and the inverted clock signal *φ which are supplied to the transfer gate TM1A and is sent out to the inverter circuits INV1A and INV3A. The data signal supplied from the transfer gate TM1A to the inverter circuit INV1A is possible to be taken in only when the power supply voltage is supplied to the inverter circuit INV1A in response to the sleep mode switching signal SL and the inverted sleep mode switching signal SLB.

The output signals from the inverter circuits INV1A and INV3A are sent out to the subsequent stage of the circuit as the output signal Q1B of the latch circuit and is sent out to the inverter circuit INV2A. The output signal from the inverter circuit INV2A is sent out to the transfer gate TM2A. The transfer gate TM2A sends out the output signal of the inverter circuit INV2A to the input side of the inverter circuits INV1A and INV3A at the timing of the clock signal φ and the inverted clock signal *φ. Thus, a latching operation of the data signal is performed.

In case of an active mode in which the sleep mode switching signal SL with a low potential (SL="0") and the inverted sleep mode switching signal SLB with a high potential (SLB="1") are applied, the control transistors HP1A and HN1A are set to the conductive state. The sequential circuit functions as the high-speed latch circuit by the transistors of the inverter circuits INV1A, INV2A and INV3A, and the transistors of the transfer gates TM1A and TM2A.

Next, in case of the sleep mode in which the sleep mode switching signal SL with the high potential (SL="1") and the inverted sleep mode switching signal SLB with the low potential (SLB="0") are applied, the control transistors HP1A and HN1A are set to the non-conductive state to block off the supply of the power supply voltage to the inverter circuit INV1A. In this case, if the state in which the clock signal φ with the low potential (φ="0") and the inverted clock signal *φ with the high potential (*φ="1") are applied is fixed in advance and an operation mode is switched to the sleep mode (SL="1" and SLB="0"), a bistable circuit holds data. At this time, the bistable circuit is composed of the inverter circuit INV3A which is connected with the inverter circuit INV1A in parallel and the inverter circuit INV2A through the transfer gate TM2A which is in the conductive state. Therefore, the internal state of the latch circuit is never destroyed.

Also, in the sleep mode (SL="1" and SLB="0"), the inverter circuit INV1A which is composed of the lower threshold type transistor is supplied with the power supply voltage through the control transistors HP1A and HN1A with the high threshold values in the blocking-off state. Therefore, the sub-threshold leakage current never increases power consumption.

Also, the power supply voltage is directly supplied to the inverter circuits INV2A and INV3A. However, the inverter circuits INV2A and INV3A are composed of the high threshold type transistors. Therefore, in the stationary state, the power consumption due to the sub-threshold leakage current never increases.

It should be noted that the latch circuit 10B has the same structure as the latch circuit 10A except for the point that the data signal D2B is inverted by the inverter circuit INV2I and the output signal of the latch circuit 10B is a signal Q2B.

In the conventional sequential circuit shown in FIG. 1, there is a problem in that there is a combination of circuits in which the power consumption due to the sub-threshold leakage current increases in spite of the sleep mode (SL="1" and SLB="0"). The reason why the above-mentioned problem is caused in the conventional semiconductor integrated logic circuit shown in FIG. 1 which has the information holding function at the time of the sleep mode will be described.

In FIG. 1, in the case that the sleep mode switching signal SL with the high potential (SL="1") and the inverted sleep mode switching signal SLB with the low potential with (SLB="0") are applied, i.e., in the sleep mode, the control transistors HP1I and HN1I and the control transistor HP1A and HN1A are set to the blocking-off state. In this case, the clock signal φ (φ="0") of the low potential and the inverted clock signal *φ (*φ="1") of the high potential are held at the applied state. Also, as the internal data holding states of the latch circuits 10A and 10B at that time, the output of the inverter circuit INV2A is in the "1" state (therefore, the output of the inverter circuit INV3A is in the "0" state), and the output of the inverter circuit INV2B is in the "0" state (therefore, the output of the inverter circuit INV3B is in the "1" state). Moreover, it is supposed that an operation mode is switched to the sleep mode (SL="1" and SLB="0").

When the semiconductor integrated logic circuit shown in FIG. 1 is in the above-mentioned state, the DC current which is caused by the sub-threshold leakage current flows along the route shown by the thick arrow line in FIG. 1 from the higher potential side actual power supply line VDD to the lower potential side actual power supply line GND. That is, the inverter circuit INV2A which has the input state of "0" and the output state of "1" functions as the supply source of the leakage current. In this case, the leakage current passes through the transfer gate TM2A in the conductive state, passes through the transfer gate TM1A which has a large sub-threshold leakage current because it is composed of a lower threshold type transistor although it is in the non-conductive state, passes through the transistor of the n-channel type MOSFET of the inverter circuit INV1I which has a large sub-threshold leakage current because it is composed of a lower threshold type transistor although its state is unclear, further passes through the lower potential side quasi power supply line, passes through the transistor of the n-channel type MOSFET of the inverter circuit INV2I which has a large sub-threshold leakage current because it is composed of a lower threshold type transistor although it is unclear that its state is in the conductive state or non-conductive state, passes through the transfer gate TM1B which has a large sub-threshold leakage current because it is composed of a lower threshold type transistor although it is in the non-conductive state, and passes through the transfer gate TM2B which is in the conductive state. Finally, the inverter circuit INV2B which has the input state of "1" and the output state of "0" functions as a demand source of the leakage current.

As described above, in the conventional example of the latch circuit 10A or 10B shown in FIG. 1 which has the information holding function at the sleep mode, power consumption due to the sub-threshold leakage current never increases, as long as the latch circuit 10A or 10B exists independently inside the semiconductor integrated logic circuit.

However, there is a problem in that two or more latch circuits such as the latch circuits 10A and 10B increases the power consumption due to the sub-threshold leakage current through the control transistors which are composed of p- and n-channel type MOSFETs with high threshold values such as the control transistors HP1I and HN1I, by means of another CMOS logic circuit to which the power is supplied from the higher potential side power supply and the lower potential side power supply, i.e. the inverter circuits INV1I and INV2I.

In conjunction with the above description, a logic circuit is disclosed in Japanese Laid Open Patent Application (JP-A-Heisei 6-29834). In this reference, a low threshold logic circuit 20 is supplied with power from a first power supply line through a high threshold transistor TS1 and from a second power supply line through a high threshold transistor TS2. Therefore, when the transistors TS1 and TS2 are set to the OFF state, any current does not flow in the low threshold logic circuit. Also, since the threshold of the low threshold logic circuit is not necessary to be decreased, a propagation delay can be made small.

Also, a MOSFET circuit is disclosed in Japanese Laid Open Patent Application (JP-A-Heisei 9-121152). In this reference, MOSFET circuits (111 and 112) are connected between a CMOS circuit group (3) with a low threshold voltage and the power supply voltage (VDD) and between the CMOS circuit group (3) and the ground as power supply control circuits to control a wait state and an operating state. MOSFETs (M1 and M3) with a high threshold value of the. MOSFET circuits (111 and 112) are applied with back gate biases from MOSFETs (M2 and M4) with a low threshold voltage to block off a current between a back gate terminal and a gate terminal.

Also, a sense amplifier circuit is disclosed in Japanese Laid Open Patent application (JP-A-Heisei 9-274797). In this reference, a PMOS transistor (50) and an NMOS transistor (52) as switches and a level shifter are added to a sense amplifier circuit of a semiconductor memory. A first switch control signal ACTB and a second switch control signal ACT are generated by the level shifter, and a signal is level-shifted to a predetermined level and then supplied to the PMOS transistor (50) and the NMOS transistor (52).

Also, a semiconductor memory device is disclosed in Japanese Laid Open Patent Application (JP-A-Heisei 5-54693). In this reference, when a power is turned on, a fault address determining circuit (30) generates a redundancy determination signal YR and a fault address (A30). A Y address decoder (24) decodes the fault address (A30) to supply the decoding result to a transfer gate (23) and a redundancy latch circuit (32) which is provided for fault bit line pair (BL1a, BL1b). Thus, the redundancy latch circuit (32) is selected to set switches (33a, 33b) to an off state while the power is turned on. Therefore, a leakage current can be prevented from flowing to a word line (WL1) through the fault bit line pair (BL1a, BL1b) and a memory cell (1—1). In this way, increase of power consumption due to a short-circuit between bit lines and between word lines can be prevented.

Also, a static type transfer gate sequential circuit is disclosed in Japanese Laid, Open Patent Applications (JP-A-Heisei 5-122020 and JP-A-Heisei 5-122021). In these references, the static type transfer gate sequential circuit is connected between CMOS logic circuits and is composed of a transfer gate (TG), two inverters (V1, V2), an input terminal (D), an output terminal (QB), and a clock input terminal (CC). One of terminals of the transfer gate (TG) is connected to the input terminal (D), and the other terminal is connected to an input terminal of the inverter (V1). The output terminal of the inverter (V1) is connected to the output terminal (QB) and the input terminal of the inverter (V2) whose output terminal is connected to the input terminal of the inverter (V1). In this reference, a resistance value in the signal path is adjusted in the viewpoint of the operation speed. In this way, the static type transfer gate sequential circuit can operate at same high speed as that of a dynamic type, as well as can cope with a low speed operation.

Also, a logic circuit is disclosed in Japanese Laid Open Patent Application (JP-A-Heisei 6-29834). In this reference, a lower threshold voltage logic circuit is connected between a higher potential side quasi power supply line and a lower potential side quasi power supply line. A higher potential side actual power supply line and a lower potential side actual power supply line are connected to the higher potential side quasi power supply line and the lower potential side quasi power supply line through higher threshold voltage transistors (TS1 and TS2), respectively.

Also, a D-type flip-flop circuit is disclosed in Japanese Laid Open Patent Application (JP-A-Heisei 7-202647). In this reference, a CMOS transfer gate for feeding back in the flip-flop circuit is not used. The CMOS flip-flop circuit is connected to a higher potential side power supply line and a lower potential side power supply line via a p-channel MOS transistor and an n-channel MOS transistor.

SUMMARY OF THE INVENTION

Therefore, an object of the present invention is to provide a semiconductor integrated logic device with a sequential circuit which can prevent the increase of power consumption due to a sub-threshold leakage current.

Another object of the present is to provide a semiconductor integrated logic device which can prevent the increase of power consumed between a plurality of sequential circuits having an information holding function at a sleep mode.

Still another object of the present invention is to provide a semiconductor integrated logic device with a sequential circuit in which a sub-threshold leakage current can be prevented by supplying the power from power supply lines through control transistors with a high threshold value, and by adopting blocking elements with the high threshold value.

It is also an object of the present invention to provide a semiconductor integrated logic device with sequential circuits in which the interference and competition of a data signal sent out from an inverter circuit INV1 can be avoided.

Another object of the present invention is to provide a semiconductor integrated logic device with sequential circuits in which a data signal held in a bistable circuit is not destroyed in a sleep mode.

In order to achieve an aspect of the present invention, a semiconductor integrated logic circuit device with a sequential circuit includes a transferring section, an inverting section, a bistable circuit section, and a blocking section. The transferring section is provided between first and second nodes, and transfers a data signal from the first node to the second node in response to a clock signal. The inverting section is provided between the second node and a third node, and inverts the data signal on the second node to output on the third node as an inverted data signal. The bistable circuit section is connected to the second and third nodes, and holds the data signal. The blocking section is provided between the bistable circuit and the first node, and blocks off sub-threshold leakage current.

The blocking section includes a first transfer gate provided between the first and second nodes and operating in response to an operation mode signal.

When the transferring section includes two MOSFETs having a first threshold voltage and provided to transfer the data signal, the first transfer gate has a bidirectional transfer characteristic and includes p- and n-type MOSFETS having a second threshold voltage higher than the first threshold voltage and operating in response to the operation mode signal. Instead, the first transfer gate may include a MOSFET having a second threshold voltage higher than the first threshold voltage.

When the transferring section includes two MOSFETs having a first threshold voltage and provided to transfer the data signal, the bistable circuit section includes a first inverter circuit, a second inverter circuit and a second transfer gate. The first inverter circuit is connected to the second node at its input and to the third node at its output. The second inverter circuit is connected to the third node at its input and to the second node at its output. The second transfer gate is interposed between the second node and the second inverter circuit output, and transfers the data signal held by the second inverter circuit to the first inverter circuit in response to the clock signal. In this case, each of transistors of the first and second inverter circuits may include a MOSFET with a second threshold voltage higher than the first threshold voltage. Also, when the semiconductor integrated logic circuit device further includes higher and lower potential side actual power supply lines, the first and second inverter circuits are connected between the higher and lower potential side actual power supply lines. Otherwise, the second inverter circuit may be selectively connected between the higher and lower potential side actual power supply lines in response to a data holding mode signal.

In addition, when the semiconductor integrated logic circuit device further includes higher and lower potential side actual power supply lines, the inverting section includes a third inverting circuit which is selectively connected to the higher and lower potential side actual power supply lines in response to the operation mode signal. Otherwise, the inverting section may include a third inverting circuit connected between higher and lower potential side quasi power supply lines, to which a voltage is selectively supplied from higher and lower potential side actual power supply lines in response to the operation mode signal.

The semiconductor integrated logic circuit device may further include a third transfer gate blocking off the sub-threshold leakage current in response to the operation mode signal. In this case, the third transfer gate may be interposed between the inverting section and the third node. Otherwise, the third transfer gate may be interposed between the bistable circuit section and the third node.

When the transferring section includes two MOSFETs having a first threshold voltage and provided to transfer the data signal, the bistable circuit section may include a second transfer gate, a first inverter circuit, and a second inverter circuit. The second transfer gate is connected to the second node, and transfers the data signal in response to the clock signal. The first inverter circuit is connected to the second transfer gate at its output and to the third node at its input. The second inverter circuit connected to the third node at its output and to the second transfer gate at its output. In this case, each of transistors of the first and second inverter circuits may include a MOSFET with a second threshold voltage higher than the first threshold voltage. When the semiconductor integrated logic circuit device further includes higher and lower potential side actual power supply lines, the first and second inverter circuits may be connected between the higher and lower potential side actual power supply lines. Also, when the semiconductor integrated logic circuit device further includes the higher and lower potential side actual power supply lines, the second inverter circuit may be selectively connected between the higher and lower potential side actual power supply lines in response to a data holding mode signal.

When the semiconductor integrated logic circuit device further includes the higher and lower potential side actual power supply lines, the inverting section may include a third inverting circuit which is selectively connected to the higher and lower potential side actual power supply lines in response to the operation mode signal.

The inverting section may include a third inverting circuit connected between higher and lower potential side quasi power supply lines, to which a voltage is selectively supplied from higher and lower potential side actual power supply lines in response to the operation mode signal. In this case, the semiconductor integrated logic circuit device may further include a third transfer gate blocking off the sub-threshold leakage current in response to the operation mode signal. In this case, the third transfer gate may be interposed between the inverting section and the third node. Otherwise, the third transfer gate may be interposed between the bistable circuit section and the third node.

The bistable circuit section may further include a fourth transfer gate controlling transfer of the data signal between the first inverter circuit and the second inverter circuit in response to a data holding mode signal.

In the semiconductor integrated logic circuit, the blocking section may include a first transfer gate provided between the second node and the bistable circuit section and operating in response to an operation mode signal.

When the transferring section includes two MOSFETs having a first threshold voltage and provided to transfer the data signal, the first transfer gate may have a bidirectional transfer characteristic and include p- and n-type MOSFETs having a second threshold voltage higher than the first threshold voltage and operating in response to the operation mode signal. Otherwise, when the transferring section includes two MOSFETs having a first threshold voltage and provided to transfer the data signal, the first transfer gate may include a MOSFET having a second threshold voltage higher than the first threshold voltage.

When the transferring section includes two MOSFETs having a first threshold voltage and provided to transfer the data signal, the bistable circuit section may include a first inverter circuit, a first inverter circuit, and a second transfer gate. The first inverter circuit is connected to the second node at its input and to the third node at its output. The second inverter circuit is connected to the third node at its input and to the second node at its output. The second transfer gate is interposed between the second node and the second inverter circuit output, the second transfer gate transferring the data signal held by the second inverter circuit to the first inverter circuit in response to the clock signal. In this case, each of transistors of the first and second inverter circuits may include a MOSFET with a second threshold voltage higher than the first threshold voltage. Also, when the semiconductor integrated logic circuit device may further include higher and lower potential side actual power supply lines, the first and second inverter circuits may be connected between the higher and lower potential side actual power supply lines. Otherwise, when the semiconductor integrated logic circuit device may further include higher and lower potential side actual power supply lines, the second inverter circuit may be selectively connected between the higher and lower potential side actual power supply lines in response to a data holding mode signal.

In addition, when the semiconductor integrated logic circuit device further includes the higher and lower potential side actual power supply lines, the inverting section may include a third inverting circuit which is selectively connected to the higher and lower potential side actual power supply lines in response to the operation mode signal.

The inverting section includes a third inverting circuit connected between higher and lower potential side quasi power supply lines, to which a voltage is selectively supplied from the higher and lower potential side actual power supply lines in response to the operation mode signal. At this time, the semiconductor integrated logic circuit device may further include a third transfer gate blocking off the sub-threshold leakage current in response to the operation mode signal. The third transfer gate may be interposed between the inverting section and the third node. Otherwise, the third transfer gate may be interposed between the bistable circuit section and the third node.

The transferring section may include two MOSFETs having a first threshold voltage and provided to transfer the data signal. At this time, the bistable circuit section may include a second transfer gate connected to the second node, the second transfer gate transferring the data signal in response to the clock signal, a first inverter circuit connected to the second transfer gate at its output and to the third node at its input, and a second inverter circuit connected to the third node at its output and to the second transfer gate at its output. In this case, each of transistors of the first and second inverter circuits may include a MOSFET with a second threshold voltage higher than the first threshold voltage. Otherwise, the first and second inverter circuits may be connected between the higher and lower potential side actual power supply lines.

The semiconductor integrated logic circuit device may further include the higher and lower potential side actual power supply lines. At this time, the second inverter circuit may be selectively connected between the higher and lower potential side actual power supply lines in response to a data holding mode signal.

Also, the inverting section may include a third inverting circuit which is selectively connected to the higher and lower potential side actual power supply lines in response to the operation mode signal.

The inverting section may include a third inverting circuit connected between higher and lower potential side quasi power supply lines, to which a voltage is selectively supplied from higher and lower potential side actual power supply lines in response to the operation mode signal. At this time, the semiconductor integrated logic circuit device may further include a third transfer gate blocking off the sub-threshold leakage current in response to the operation mode signal.

The third transfer gate may be interposed between the inverting section and the third node. Also, the third transfer gate may be interposed between the bistable circuit section and the third node.

The bistable circuit section may further include a fourth transfer gate controlling transfer of the data signal between the first inverter circuit and the second inverter circuit in response to a data holding mode signal.

The semiconductor integrated logic circuit device may includes the sequential circuits, and a CMOS logic circuit outputting to a plurality of the data signals to the plurality of sequential circuits, respectively.

DESCRIPTION OF THE PREFERRED EMBODIMENTS

Hereinafter, a semiconductor integrated logic circuit with latch circuits of the present invention will be described with reference to the attached drawings.

It should be noted that there is a copending U.S. patent application Ser. No. 09/310,859, filed May 13, 1999, entitled "SEMICONDUCTOR CIRCUIT WITH SEQUENTIAL CIRCUIT WHICH CAN PREVENT LEAKAGE CURRENT", claiming a priority based on Japanese patent application No. Heisei 10-138856, invented by Tadahiko OGAWA who is an inventor of the present application, and assigned to an assignee who is an assignee of the present application. The content of the copending U.S. application is incorporated herein by reference.

The specific embodiments of the present invention will be described below. However, the present invention is not limited to them. The scope of the present invention should be understood from the claims.

Next, the semiconductor integrated circuit with the sequential circuits according to the first embodiment of the present invention will be described below in detail.

Figure 2:
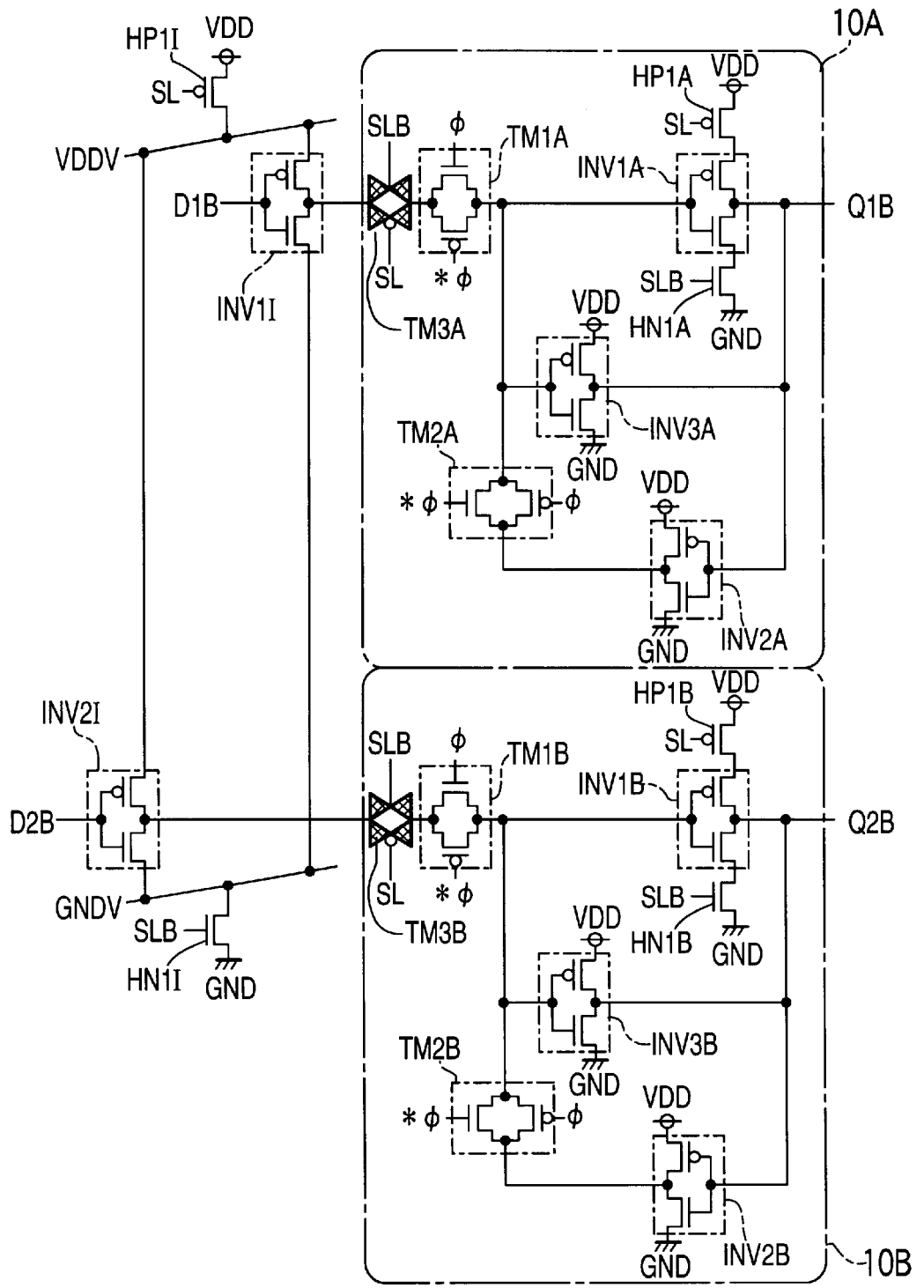
FIG. 2 is a circuit diagram illustrating the structure of the sequential circuit according to the first embodiment of the present invention.

FIG. 2 is a block diagram illustrating the structure of the semiconductor integrated logic circuit with the sequential circuit which has an information holding function at the sleep mode according to the first embodiment of the present invention.

Referring to FIG. 2, the semiconductor integrated logic circuit is composed of a CMOS logic circuit and latch circuits as the sequential circuits 10A and 10B. The latch circuit has a function to hold an information data which is outputted from the CMOS logic circuit at a sleep mode. The latch circuit as the sequential circuit is composed of a transferring section, an inverting section, a bistable circuit section and a blocking section. The bistable circuit section is composed of a combination of inverter circuits and a transfer gate. The bistable circuit section operates in synchronous with a clock signal $\phi$ and an inverted clock signal $*\phi$ to latch the information data which is outputted from the logic circuit section. The blocking section prevents a sub-threshold leakage current which is consumed between the CMOS logic circuit section and the latch circuit at the sleep mode.

Thus, the latch circuit as the sequential circuit according to the present invention can prevent the power consumption due to the sub-threshold leakage current which flows through the CMOS logic circuit section, when the plurality of latch circuits exist in the semiconductor integrated logic circuit.

The CMOS logic circuit is composed of inverter circuits INV1I and INV2I and control transistors HP1I and HN1I. The control transistor HP1I is composed of a p-channel type MOSFET with a high threshold value and is connected with a higher potential side actual power supply line VDD at the source electrode and with a higher potential side quasi power supply line VDDV at the drain electrode. Moreover, an electric connection between the higher potential side actual power supply line and the higher potential side quasi power supply line is set to the conductive state or the blocking-off state in response to a sleep mode switching signal SL which is applied to the gate electrode of the control transistor HP1I.

Also, the control transistor HN1I is composed of an n-channel type MOSFET with a high threshold value, and is connected with a lower potential side actual power supply GND at the source electrode and with a lower potential side quasi power supply GNDV at the drain electrode. Moreover, an electric connection between the lower potential side actual power supply line and the quasi power supply line is set to the conductive state or non-conductive state in response to an inverted sleep mode switching signal SLB which is applied to the gate electrode of the control transistor HN1I. In this case, the inverted sleep mode switching signal SLB is the signal which is obtained by inverting the sleep mode switching signal SL and is sent out from a sleep mode control circuit (not shown).

Also, the CMOS logic circuit including this inverter circuits INV1I and INV2I is composed of lower threshold type transistors. The inverter circuits INV1I and INV2I performs a buffering operation of the data signals D1B and D2B which are supplied to the latch circuits 10A and 10B, respectively.

The inverter circuit INV1I is composed of an n-channel type MOSFET as a lower threshold type transistor and a p-channel type MOSFET as a lower threshold type transistor. The gate electrodes of the transistors are connected in common to input a data signal D1B, and the drain electrodes of both the transistors are connected in common to function as the output terminal. In this way, a signal is outputted from the output terminal to the latch circuits 10A of the subsequent stage of the circuit.

The inverter circuit INV2I is composed of an n-channel type MOSFET as a lower threshold type transistor and a p-channel type MOSFET as a lower threshold type transistor. The gate electrodes of both the transistors are connected in common to input a data signal D2B, and the drain electrodes of both the transistors are connected in common to function as the output terminal. In this way, a signal is outputted to the latch circuit 10B of the subsequent stage of the circuit.

Also, the source electrode of the p-channel type MOSFET with the lower threshold value in the inverter circuit INV1I is connected with the higher potential side quasi power supply line, which is connected to the drain electrode of the control transistor HP1I through the higher potential side quasi power supply voltage line VDDV. Also, the source electrode of the n-channel type MOSFET with the lower threshold value in the inverter circuit INV1I is connected with the lower potential side quasi power supply line GNDV, which is connected to the drain electrode of the control transistor HN1I through the lower potential side quasi power supply voltage GNDV.

Next, the structure of the latch circuits 10A and 10B shown in FIG. 2 as the sequential circuits which has the information holding function at the sleep mode will be described.

The latch circuit 10A as the sequential circuit is composed of a transferring section, an inverting section, a bistable circuit section and a blocking section. A transfer gate TM3A of the blocking section is connected at one of its electrodes, to a first node as an output node of the inverter circuit INV1I of the CMOS logic circuit. A transfer gate TM1A of the transferring section is connected between a second node and the other electrode of the transfer gate TM3A. An inverter circuit INV1A of the inverting section is connected between the second node and a third node as the output node of the latch circuit 10A. The bistable circuit section is connected between the second and third nodes. The bistable circuit section is composed of inverters INV2A and INV3A and a transfer gate TM2A. The inverter INV3A is connected to the second node at its input and to the third node at its output. The inverter INV2A is connected to the third node at its input, and to one of two electrodes of the transfer gate TM2A at its output. The other electrode of the transfer gate TM2A is connected to the second node.

The transfer gate TM3A as the blocking section is composed of a transistor of the MOSFET with the high threshold value and has a bidirectional transfer characteristic. One of the two electrodes of the transfer gate TM3A is connected with the output node of the inverter circuit INV1I and the other electrode is connected with one of the electrodes of the transfer gate TM1A which have the bidirectional transfer characteristic.

The signal used to control the opening and closing operation of the transfer gate TM3A is synchronized with the sleep mode switching signal SL and the inverted sleep mode switching signal SLB as the inversion signal of the sleep mode switching signal SL. That is, in the sleep mode, the sleep mode switching signal SL (SL="1") with the high potential and the inverted signal SLB (SLB="0") with the low potential are applied to the transfer gate TM3A to set the transfer gate TM3A to the non-conductive state. In an active mode, the sleep mode switching signal SL (SL="0") with the low potential and the inverted sleep mode switching signal SLB (SLB="1") with the high potential are applied to the transfer gate TM3A to set the transfer gate TM3A to the conductive state.

Also, the transfer gate TM1A is composed of an n-channel type MOSFET as a lower threshold type transistor and a p-channel type MOSFET as a lower threshold type transistor. The source electrode and the drain electrode of both the transistors are alternately connected in parallel. One of the electrodes of the transfer gate TM1A having the bidirectional characteristic is connected with one of the electrodes of the transfer gate TM3A having the bidirectional characteristic and the other electrode is connected with the input node of the inverter circuit INV1A as the second node. Moreover, the clock signal φ is applied to the gate electrode of the n-channel type MOSFET of the transfer gate TM1A, and the inverted clock signal *φ which is the inverted signal of the clock signal φ is applied to the gate electrode of the p-channel type MOSFET of the transfer gate TM1A. The transfer gate TM2A have the same structure as the transfer gate TM1A. On of the electrode of the transfer gate TM2A having the bidirectional characteristic is connected with the input node of the inverter circuit INV1A and the other electrode is connected with the output node of the inverter circuit INV2A. It should be noted that the transistors of the transfer gate TM2A may be MOSFETs with the lower threshold value or MOSFETs with the high threshold value.

The inverter circuit INV1A, INV2A and INV3A have the same structure as the inverter circuits INV1I and INV2I. Each of transistors of the inverter circuit INV1A is composed of a MOSFET with the lower threshold value. However, each of transistors of the other inverter circuits INV2A and INV3A is composed of a transistor as a MOSFET with the high threshold value.

Also, the control transistor HP1A is composed of a p-channel type MOSFET with the high threshold value and is connected with the higher potential side actual power supply line VDD at the source electrode. The electric connection with the drain electrode of the control transistor HP1A is set to the conductive state or the blocking-off state in response to the sleep mode switching signal SL which is applied to the gate electrode of the control transistor HP1A. Also, the control transistor HN1A is composed of an n-channel type MOSFET with the high threshold value and is connected to the lower potential side actual power supply line GND at the source electrode. The electric connection with the drain electrode of the control transistor HN1A is set to the conductive state or the blocking-off state in response to the inverted sleep mode switching signal SLB which is applied to the gate electrode of the control transistor HN1A. Also, the drain electrode of the control transistor HP1A is connected with the source electrode of the p-channel type MOSFET with the lower threshold value of the inverter circuit INV1A, and the source electrode of the n-channel type MOSFET with the lower threshold value of the inverter circuit INV1A is connected with the drain electrode of the control transistor HN1A.

The inverter circuit INV3A is connected in parallel to the inverter circuit INV1A. The inverter circuit INV3A is different from the inverter circuit INV1A in the following point. That is, the inverter circuit INV3A receives a power supply voltage directly from the higher potential side actual power supply line VDD and the lower potential side actual power supply line GND. The power supply voltage does not pass through the control transistors such as the control transistors HP1A and HN1A.

Also, an output node of the inverter circuit INV1A and that of the inverter circuit INV3A are connected in common to the third node which functions as the output node of the latch circuits 10A, and sends out a latch output signal Q1B to the subsequent stage of the circuit.

Also, the output nodes of the inverter circuits INV1A and INV3A are connected with the input node of the inverter circuit INV2A. In this case, the inverter circuit INV2A is composed of two MOSFETs as the transistors with the high threshold values, like the inverter circuit INV3A. Moreover, the inverter circuit INV2A receives the power supply voltage directly from the higher potential side actual power supply line VDD and the lower potential side actual power supply line GND.

The latch circuit 10B is composed of three transfer gates TM1B, TM2B and TM3B and three inverter circuits INV1B, INV2B and INV3B. The latch circuit 10B has the same structure as the latch circuits 10A. The difference point between the latch circuit 10A and the latch circuit 10B is in that the data signal which is obtained by inverting the data signal D2B by the inverter circuit INV2I is supplied, and the output signal of the latch circuit 10B is a signal Q2B.

Next, the operation of the latch circuit 10A shown in FIG. 2 as the sequential circuit which has the information holding function at this time of the sleep mode according to the first embodiment of the present invention will be described with reference to FIGS. 3A to 3E.

Figure 3:
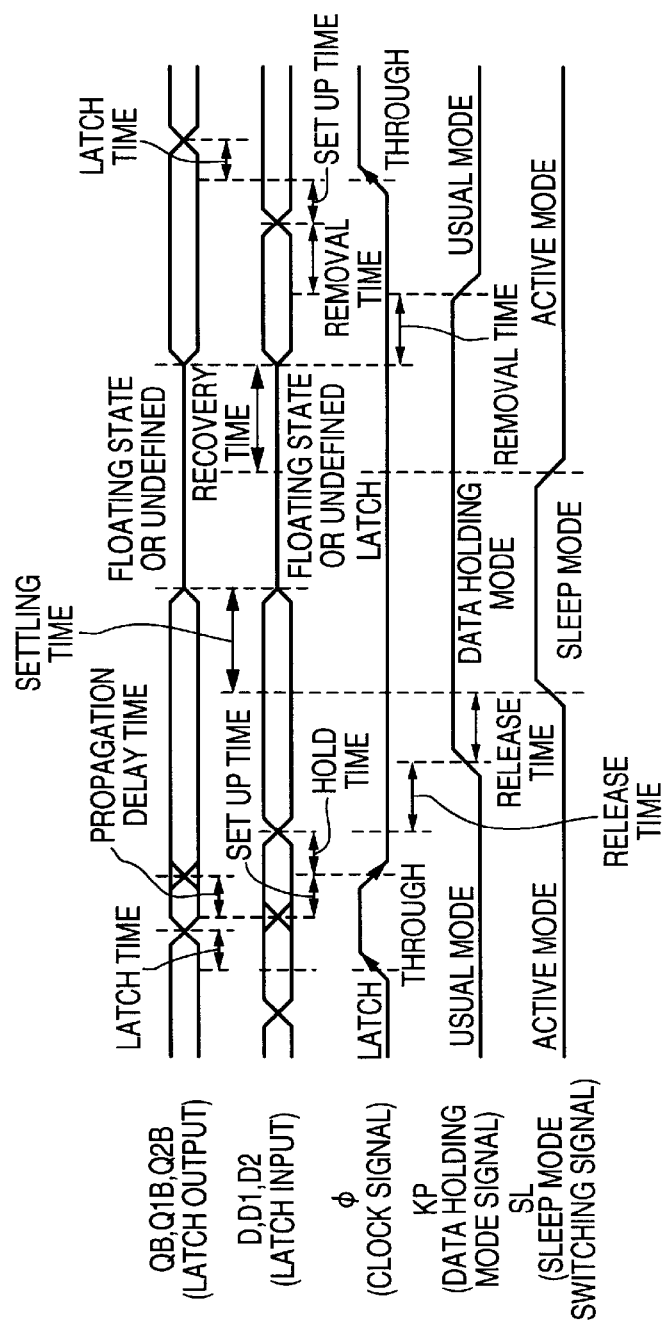
FIGS. 3A to 3E are timing charts to explain the sequential circuit according to the first embodiment of the present invention operates.

First, the active mode shown in FIG. 3E in which sleep mode switching signal SL (SL="0") with the low potential and the inverted the sleep mode switching signal SLB (SLB="1") with the high potential are applied will be described.

The control transistors HP1A and HN1A are set to the conductive state, and the higher potential side power supply voltage and the lower potential side power supply voltage are supplied to the inverter circuit INV1A to set the inverter circuit INV1A to the active state. Also, the transfer gate TM3A is set to the conductive state such that the data signal which is sent out from the inverter circuit INV1I of the CMOS logic circuit can be transferred to the transfer gate TM1A. Therefore, the data signal D1B is inverted by the inverter circuit INV1I and is supplied to the latch circuits 10A. Then, the inverted data signal is sent out to the transfer gate TM1A through the transfer gate TM3A which is in the conductive state in the active mode.

The inverted data signal which has been sent out from the transfer gate TM3A is taken in by the transfer gate TM1A at the timing of the clock signal φ and the inverted clock signal *φ which are supplied to the transfer gate TM1A, and is sent out to the inverter circuits INV1A and INV3A. In this case, the inverter circuit INV1A is set to the active state in response to the sleep mode switching signal SL and the inverted sleep mode switching signal SLB. As a result, it is set to the state in which the inverter circuit INV1A is possible to take in the data signal from the transfer gate TM1A. The signal which has passed through the inverter circuits INV1A and INV3A is sent out to the subsequent stage of the circuit as the output signal Q1B of the latch circuit 10A, Also, the passing signal is sent out to the inverter circuit INV2A. The output of the inverter circuit INV2A is sent out to the transfer gate TM2A.

The transfer gate TM2A feeds back the signal from the inverter circuit INV2A to the input side of the inverter circuits INV1A and INV3A at the timing of the clock signal φ and the inverted clock signal *φ). The inverter circuits INV1A and INV3A take the data signal therein. Thus, the data signal is latched.

Next, the sleep mode shown in FIG. 3E in which the sleep mode switching signal SL (SL="1") with the high potential and the inverted sleep mode switching signal SLB (SLB="0") with the low potential are applied will be described.

The control transistors HP1A and HN1A are set to the non-conductive state, the power supply from the higher potential side power supply voltage and the lower potential side power supply voltage to the inverter circuit INV1A is stopped, and the inverter circuit INV1A is set to the non-active state.

Also, the transfer gate TM3A is set to the non-conductive state to block off the data signal which is sent out from the CMOS logic circuit to the transfer gate TM1A. In this case, it Is supposed that the clock signal φ (φ="0") with the low potential and the inverted clock signal *φ (*φ="1") with the high potential are fixed to the applied state in advance, and the operation mode is switched to the sleep mode (SL="1" and SLB="0"). In this case, the data signal remains latched In the bistable circuit section which is composed of the inverter circuit INV3A and the inverter circuit INV2A through the transfer gate TM2A in the conductive state. Therefore, the internal state of the latch circuits 10A is never destroyed.

Next, the effect of the first embodiment of the present invention will be described.

In FIG. 2, the sleep mode switching signal SL (SL="1") with the high potential and the inverted sleep mode switching signal SLB (SLB="0") with the low potential are applied. That is, in the sleep mode, the control transistors HP1I and HN1I, and the control transistors HP1A and HN1A are set to the blocking-off state. Therefore, in the sleep mode (SL="1" and SLB="0"), because the power supply voltage is not supplied to the inverter circuit INV1A which is composed of the lower threshold type transistor, through the control transistors HP1A and HN1A with the high threshold value in the blocking-off state. There is not increase of the power consumption due to the sub-threshold leakage current.

It should be noted that the power supply voltage is directly supplied to the inverter circuits INV2A and INV3A. However, because the inverter circuits INV2A and INV3A are composed of the transistors with the high threshold values, there is not increase of the power consumption due to the sub-threshold leakage current in the stationary state. In this case, let's consider a case where the problem that the sub-threshold leakage current increases power consumption occurs in the conventional semiconductor integrated logic circuit shown in FIG. 1. It is supposed that the same condition is applied to the semiconductor integrated logic circuit according to the first embodiment of the present invention shown in FIG. 2. In this case, it will be proved that the increase of the power consumption due to the sub-threshold leakage current is not caused in the first embodiment of the present invention.

Referring to FIG. 2, in the semiconductor integrated logic circuit with the sequential circuit according to the first embodiment of the present invention, the following conditions are supposed. That is, the clock signal φ (φ="0") with the low potential and the inverted clock signal *φ (*φ="1") with the high potential are supposed to be previously fixed to the applied state. Also, the internal data holding states of the latch circuits 10A and 10B at that time are supposed to be set to the state in which the output of the inverter circuit INV2A is in the state of "1" (therefore, the output of the inverter circuit INV3A is in the state of "0"), and the output of the inverter circuit INV2B is in the state of "0" (therefore, the output of the inverter circuit INV3B is in the state of "1"). In addition, the operation mode is supposed to be changed to the sleep mode (SL="1" and SLB="0").

When the semiconductor integrated logic circuit shown in FIG. 2 is in the above-mentioned state, the DC current which is caused by the sub-threshold leakage current leaks out along the route shown by the thick arrow line in FIG. 2 from the higher potential side actual power supply line VDD to the lower potential side actual power supply line GND.

The semiconductor integrated logic circuit according to the first embodiment of the present invention shown in FIG. 2 is in the above-mentioned state. At this time, the inverter circuit INV2A having the input state of "0" and the output state of "1" can function as the supply source of the leakage current. Therefore, there is possibility that the leakage current passes through the transfer gate TM2A in the conductive state, passes through the transfer gate TM1A having a large sub-threshold leakage because it is composed of the lower threshold type transistor although it is in the non-conductive state.

However, in the semiconductor integrated logic circuit according to the first embodiment of the present invention shown in FIG. 2, the leakage current from the inverter circuit INV2A as the supply source is prevented by the transfer gate TM3A. As a result, the leakage current never flows out from the latch circuits 10A to the other CMOS logic circuit.

Also, when the semiconductor integrated logic circuit shown in FIG. 2 is in the above-mentioned state, the inverter circuit INV2B having the input state of "1" and the output state of "0" is possibly to set as the demand source of the leakage current. At this time, there is possibility that the leakage current passes through the transfer gate TM2B in the conductive state and passes through the transfer gate TM1B having a large sub-threshold leakage current because it is composed of a lower threshold type transistor although it is in the non-conductive state.

However, the leakage current from the inverter circuit INV2B as the demand source is prevented by the transfer gate TM3B. As a result, the leakage current never flows out from the other CMOS logic circuit into the latch circuit 10B.

As described above, when the two latch circuits 10A and 10B exist as the sequential circuit according to the first embodiment of the present invention shown in FIG. 2, the increase of the power consumption due to the sub-threshold leakage current through the CMOS logic circuit can be prevented. This is because the inverter circuits INV1I and INV2I of the CMOS logic circuit are supplied with the power supply voltage through the control transistors which are composed of the p- and n-channel type MOSFETs with the high threshold values, such as the control transistors HP1I and HN1I.

Of course, the sequential circuit which has the information holding function at the sleep mode according to the first embodiment of the present invention does not cause the increase of the power consumption due to the sub-threshold leakage current, as long as each of the latch circuits exists independently inside the semiconductor integrated logic circuit.

Next, the semiconductor integrated logic circuit with the latch circuit as the sequential circuit which has the information holding function at the time of the sleep mode according to the second embodiment of the present invention will be described below.

Figure 4:
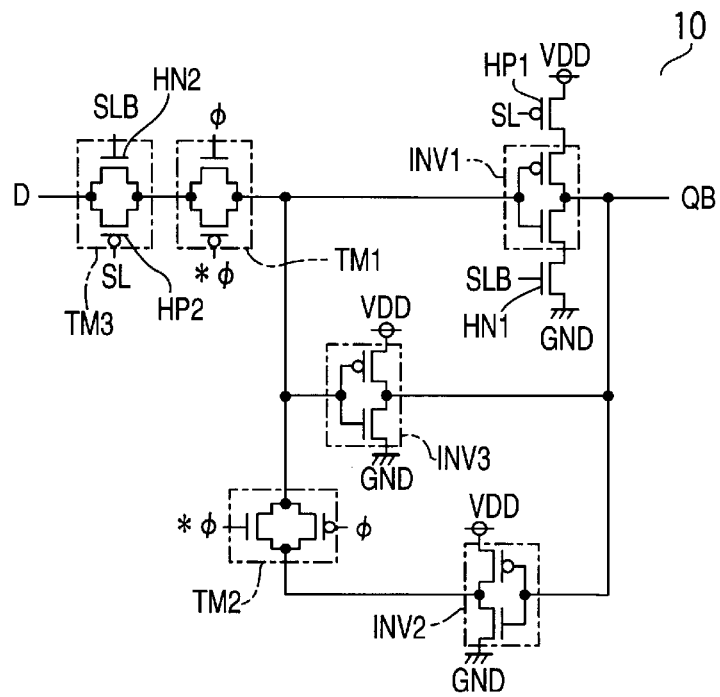
FIG. 4 is a circuit diagram illustrating the structure of the sequential circuit according to the second embodiment of the present invention.

FIG. 4 is a circuit diagram illustrating the structure of the semiconductor integrated logic circuit with the latch circuit as the sequential circuit.

Referring to FIG. 4, the latch circuit 10 as the sequential circuit according to the second embodiment of the present invention is composed of the three transfer gates TM1, TM2 and TM3 and the three inverter circuits INV1, INV2 and INV3. The latch circuit 10 has the device has the same, structure as that of the latch circuits 10A according to the first embodiment of the present invention shown in FIG. 2. The different point between the latch circuit 10 and the latch circuit 10A is in the following point. That is, the data signal D is supplied to the transfer gate TM3, a signal QB is outputted from the latch circuit, and the transfer gate TM3 which corresponds to the transfer gate TM3A of the latch circuits 10A of FIG. 2 is composed of transistors.

The transfer gate TM3 according to the second embodiment of the present invention shown in FIG. 4 is composed of the transistor HP2 which is composed of a p-channel type MOSFET with the high threshold value and the transistor HN2 which is composed of an n-channel type MOSFET with the high threshold value. The source electrodes and the drain electrodes of the transistors are alternately connected in parallel. The data signal D is supplied to the first node as one of the electrodes of the transfer gate TM3 which has the bidirectional characteristic and the other electrode thereof is connected with one of the electrodes of the transfer gate TM1 which has the bidirectional characteristic.

The inverted sleep mode switching signal SLB which is the inverted signal of the sleep mode switching signal SL is applied to the gate electrode of the transistor HN2 of the transfer gate TM3 which is composed of an n-channel type MOSFET with the high threshold value. Also, the sleep mode switching signal SL is applied to the gate electrode of the transistor HP2 which is composed of a p-channel type MOSFET with the high threshold value.

In the sleep mode, the sleep mode switching signal SL (SL="1") with the high potential voltage VDD and the inverted sleep mode switching signal SLB (SLB="0") with the low potential voltage GND are applied to the transfer gate TM3 so that the transfer gate TM3 is set to the nonconductive state. In the active mode, the sleep mode switching signal SL (SL="0") of the low potential voltage GND and inverted sleep mode switching signal SLB (SLB="1") with the high potential voltage VDD are applied to the transfer gate TM3 so that the transfer gate TM3 is set to the conductive state. As a result, the opening and closing control of the transfer gate TM3 is performed.

Next, the semiconductor integrated logic circuit with the latch circuit as the sequential circuit which has the information holding function at the time of the sleep mode according to the third embodiment of the present invention will be described below.

Figure 5:
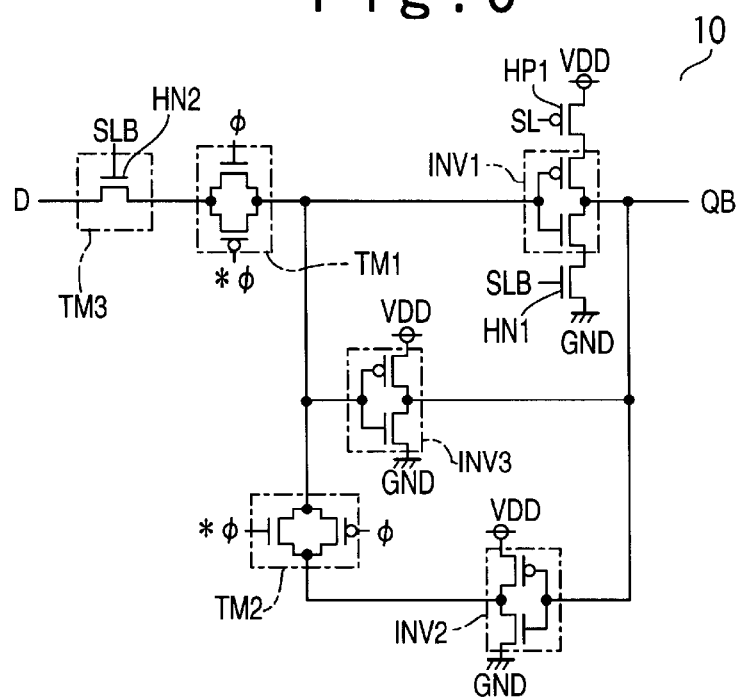
FIG. 5 is a circuit diagram illustrating the structure of the sequential circuit according to the third embodiment of the present invention.

FIG. 5 is a circuit diagram illustrating the latch circuit according to the third embodiment of the present invention.

Referring to FIG. 5, the latch circuit according to the third embodiment of the present invention shown in FIG. 5 is a modification example of the latch circuit shown in FIG. 4. The latch circuit in the third embodiment has the same structure as the latch circuits 10A which is shown in FIG. 2. The difference point between the latch circuit 10 in the third embodiment and the latch circuit 10A in the first embodiment is in the following point. That is, the data signal D is supplied, the output of the latch circuit is a signal QB, and the transfer gate TM3 which corresponds to the transfer gate TM3A of the latch circuits 10A of FIG. 2 is composed of a transistor.

The transfer gate TM3 in the third embodiment of the present invention shown in FIG. 5 is composed only of the transistor HN2 which is composed of the n-channel type MOSFET with the high threshold value. The data signal D is supplied to the first node as one of the source electrode and the drain electrode. The other electrode is connected with one of the electrodes of the transfer gate TM1 which has a bidirectional characteristic. Also, the inverted sleep mode switching signal SLB which is the inverted signal of the sleep mode switching signal SL is applied to the gate electrode of the transistor HN2 of the transfer gate TM3 which is composed of an n-channel type MOSFET with the high threshold value.

In the sleep mode, the inverted sleep mode switching signal SLB (SLB="0") with the low potential voltage is applied to the transfer gate TM3 so that the transfer gate TM3 is set to the non-conductive state. Also, in the active mode, the inverted sleep mode switching signal SLB (SLB= "1") with the high potential voltage is applied to the transfer gate TM3, so that the transfer gate TM3 is set to the conductive state. As a result, the opening and closing control of the transfer gate TM3 is performed.

Also, in the active mode, the signal voltage of the inverted sleep mode switching signal SLB (SLB="1") is set to a summation of the threshold value voltage of the transistor HN2 and the higher potential side power supply voltage VDD. In this case, the data signal D (D="1") with the higher potential side power supply voltage as the high level can be transferred to the transfer gate TM1 of the subsequent stage of the circuit through the transfer gate TM3.

It should be noted that the transfer gate TM3 as the switching element in the third embodiment of the present invention shown in FIG. 5 is composed of the n-channel type MOSFET with the high threshold value which is controlled in response to the inverted sleep mode switching signal SLB. The signal voltage of the inverted sleep mode switching signal SLB used to set the transfer gate TM3 to the conductive state is set to be equal to the voltage of addition of the threshold value voltage of the n-channel type MOSFET with the high threshold value and the higher potential side voltage, as described above. However, the present invention is not limited to this. The transfer gate TM3 as the switching element may be composed of a p-channel type MOSFET with the high threshold value which is controlled in response to the sleep mode switching signal SL. Also, the signal voltage of the inverted sleep mode switching signal used to set the transfer gate TM3 to the conductive state is set to be equal to addition of the threshold value voltage of the p-channel type MOSFET with the high threshold value and the higher potential side voltage.

Next, the semiconductor integrated logic circuit with the latch circuit as the sequential circuit which has the information holding function at the time of the sleep mode according to the fourth embodiment of the present invention.

Figure 6:
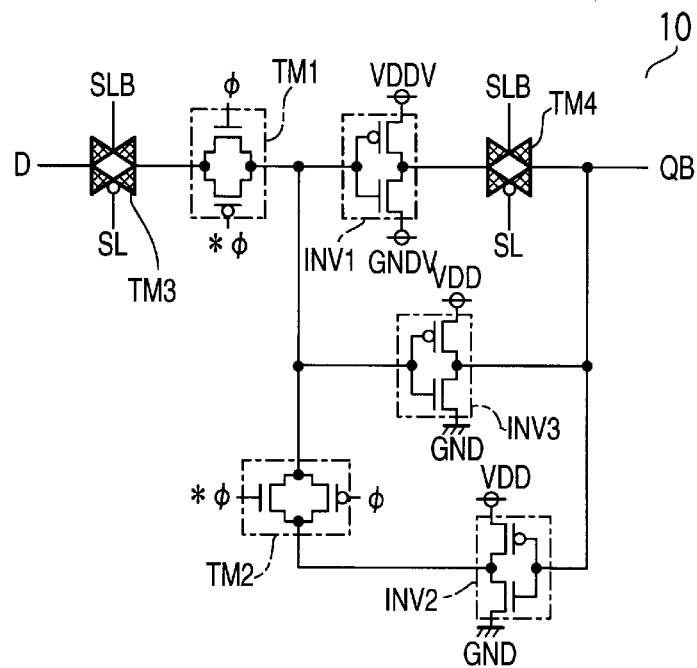
FIG. 6 is a circuit diagram illustrating the structure of the sequential circuit according to the fourth embodiment of the present invention.
Figure 7:
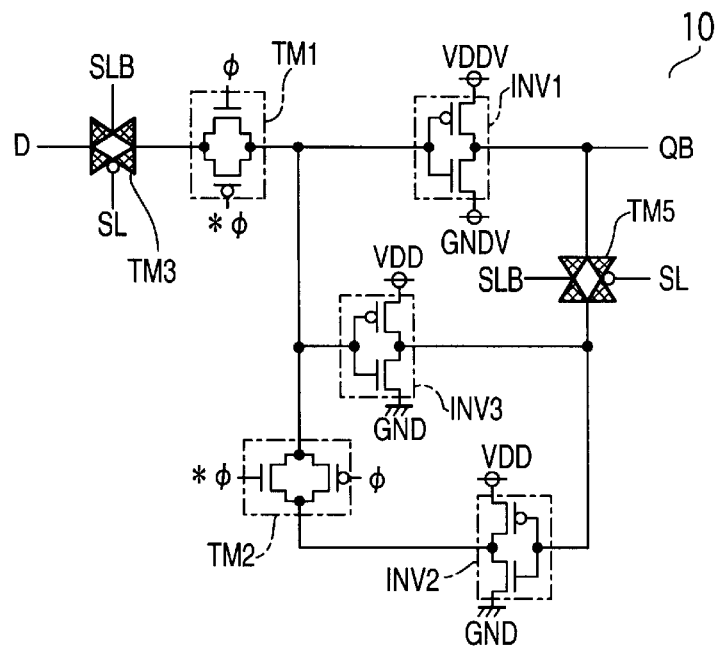
FIG. 7 is a circuit diagram illustrating the structure of a modification of the sequential circuit according to the fourth embodiment of the present invention.

FIG. 6 is a circuit diagrams illustrating the structure of the latch circuit 10 as the sequential circuit according to the fourth embodiment of the present invention. FIG. 7 is a circuit diagrams illustrating the structure of a modification of the latch circuit 10 as the sequential circuit in the fourth embodiment of the present invention.

Referring to FIG. 6, the latch circuit is composed of four transfer gates TM1, TM2, TM3 and TM4 and three inverter circuits INV1, INV2 and INV3. The latch circuit shown in FIG. 7 is composed of four transfer gates TM1, TM2, TM3 and TM5 and three inverter circuits INV1, INV2 and INV3.

The latch circuit in the shown in FIG. 6 has the same structure as the latch circuits 10A shown in FIG. 2. The difference points between the latch circuit 10 shown in FIG. 6 and the latch circuit 10A shown in FIG. 2 are in the following point. That is, the data signal D is supplied to the transfer gate TM3 and the output of the latch circuit is a signal QB. Also, the difference point is in that the inverter circuit INV1 which corresponds to the inverter circuit INV1A of the latch circuits 10A of FIG. 2 receives the power supply voltage from the higher potential side quasi power supply VDDV and the lower potential side quasi power supply GNDV. In addition, the difference point is in that the transfer gate TM4 which is composed of transistors with the high threshold value is connected between the output of the inverter circuit INV1 and the third node.

Also, the latch circuit shown in FIG. 7 has the same structure as the latch circuits 10A which is shown in FIG. 2. The difference points between the latch circuit 10 shown in FIG. 6 and the latch circuit 10A shown in FIG. 2 are in the following point. That is, the data signal D is supplied to the transfer gate TM3 and the output of the latch circuit is a signal QB. Also, the inverter circuit INV1 which corresponds to the inverter circuit INV1A of the latch circuits 10A of FIG. 2 receives the power supply voltage from the higher potential side quasi power supply line VDDV and the lower potential side quasi power supply line GNDV. In addition, the transfer gate TM5 which is composed of a transistor with the high threshold value is connected between the output of the inverter circuit INV3 and the third node.

The voltage are supplied from the higher potential side quasi power supply line VDDV and the lower potential side quasi power supply line GNDV to the inverter circuit INV1 shown in FIG. 6 or FIG. 7. The voltages are generated from a circuit having the same structure as the higher potential side quasi power supply VDDV and lower potential side quasi power supply GNDV shown in FIG. 2. That is, like the case shown in FIG. 2, the control transistor HP1I is composed of a p-channel type MOSFET with the high threshold value. The control transistor HP1I is connected with the higher potential side actual power supply line VDD at the source electrode and with the higher potential side quasi power supply line VDDV at the drain electrode. Moreover, the electric connection between the higher potential side actual power supply line VDD and the higher potential side quasi power supply line VDDV is controlled to be in the conductive state or the blocking-off state in response to the sleep mode switching signal (SL) which is applied to the gate electrode of the control transistor HP1I.

Also, the control transistor HN1I which is composed of an n-channel type MOSFET with the high threshold value is connected with the lower potential side actual power supply line GND at the source electrode and with the lower potential side quasi power supply line GNDV at the drain electrode. Moreover, the electric connection between the lower potential side actual power supply line GND and the lower potential side quasi power supply line is controlled to be in the conductive state or the blocking-off state in response to the inverted sleep mode switching signal SLB which is applied to the gate electrode of the control transistor HN1I.

The power supply is performed from the higher potential side quasi power supply line and the lower potential side quasi power supply line to the inverter circuit INV1 shown in FIG. 6 or FIG. 7. However, if the inverter circuit INV1 receives the power supply from at least one of the higher potential side quasi power supply line and the lower potential side quasi power supply line, there is not the increase of the power consumption due to the sub-threshold leakage current which is caused by the inverter circuit INV1, which is composed of transistors with the lower threshold values having a large sub-threshold leakage current in the sleep mode.

The signal which controls the opening and closing operation of the transfer gate TM4 or TM5 which are shown in FIG. 6 or FIG. 7 is synchronized with the sleep mode switching signal SL and the inverted sleep mode switching signal SLB which is the inverted signal of the sleep mode switching signal SL. That is, in the sleep mode, the sleep mode switching signal SL (SL="1") with the high potential and the inverted sleep mode switching signal SLB (SLB="0") with the low potential are applied to the transfer gate TM4 or TM5 to set the transfer gate TM4 or TM5 to the non-conductive state. Also, in the active mode, the sleep mode switching signal SL (SL="0") with the low potential and the inverted sleep mode switching signal SLB (SLB="1") with the high potential are applied to the transfer gate TM4 or TM5 to set the transfer gate TM4 or TM5 to the conductive state.

In the sleep mode (SL="1" and SLB="0"), the transfer gate TM4 or TM5 in the non-conductive state functions to prevent the DC current which is caused due to the sub-threshold leakage current.

When the transfer gate TM4 or TM5 does not exist, the inverter circuit INV3 functions as the supply source or the demand source of the leakage current. The leakage current passes through the inverter circuit INV1 which has a large sub-threshold leakage current because it is composed of a lower threshold type transistor, passes through both the higher potential side quasi power supply line and the lower potential side quasi power supply line which are set to the floating state in the sleep mode, and passes through the inverter circuit INV1 of the other the latch circuit in the semiconductor integrated logic circuit. In this way, the leak current route in which the inverter circuit INV3 functions as the supply source or demand source of the leakage current is formed for the DC current to flow between the higher potential side actual power supply and the lower potential side actual power supply due to the sub-threshold leakage current.

Therefore, in the fourth embodiment of the present invention shown in FIG. 6 and the modification of the fourth embodiment of the present invention shown in FIG. 7, the transfer gates TM4 and TM5 are set to the non-conductive state in the sleep mode (SL="1" and SLB="0"). Thus, the DC current which is caused due to the sub-threshold leakage current is prevented by the transfer gate TM4 or TM5.

Figure 8:
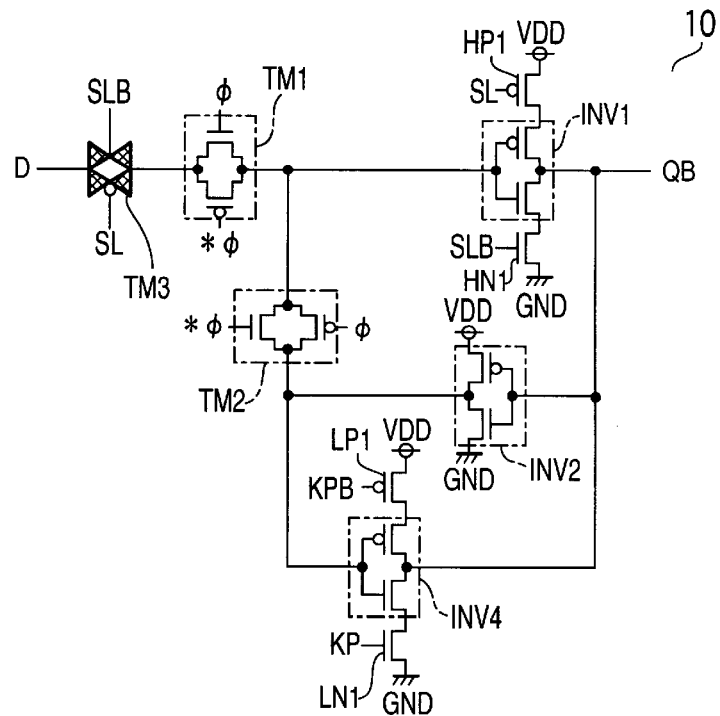
FIG. 8 is a circuit diagram illustrating the structure of the sequential circuit according to the fifth embodiment of the present invention.

Next, the semiconductor integrated logic circuit with the latch circuit as the sequential circuit which has the information holding function at the time of the sleep mode according to the fifth embodiment of the present invention. FIG. 8 is a circuit diagram illustrating the structure of the latch circuit as the sequential circuit according to the fifth embodiment of the present invention.

Referring to FIG. 8, the latch circuit 10 as the sequential circuit according to the fifth embodiment of the present invention has the same structure as the latch circuits 10A shown in FIG. 2. The different points between them are as follows. That is, in the latch circuit 10 in the fifth embodiment, the data signal D is supplied and the output of the latch circuit is a signal QB. Also, the bistable element is formed by an inverter circuit INV4 and an inverter circuit INV2 in place of the inverter circuit INV3A in the latch circuits 10A of FIG. 2, so that the latch circuit 10 in the fifth embodiment performs the data holding operation in the sleep mode.

A control transistor LP1 shown in FIG. 8 which is composed of a p-channel type MOSFET with the lower threshold value is connected to the higher potential side actual power supply line VDD at the source electrode. The electric connection with the drain electrode is controlled to be in the conductive state or the blocking-off state in response to the inverted data holding mode switching signal KPB applied to the gate electrode. The inverted data holding mode switching signal KPB is the inverted signal of the data holding mode switching signal KP.

Also, the control transistor LN1 which is composed of an n-channel type MOSFET with the lower threshold value is connected with the lower potential side actual power supply line GND at the source electrode. The electric connection with the drain electrode is controlled to be in the conductive state or the blocking-off state in response to the data holding mode switching signal KP applied to the gate electrode.

Also, the source electrode of the p-channel type MOSFET with the high threshold value of the inverter circuit INV4 is connected with the drain electrode of the control transistor LP1, and the source electrode of the n-channel type MOSFET with the lower threshold value of the inverter circuit INV4 is connected with the drain electrode of the control transistor LN1.

The operation of the latch circuit 10 according to the fifth embodiment of the present invention shown in FIG. 8 will be described with reference to FIGS. 3A to 3E. The basic operation of the latch circuit 10 in the fifth embodiment is identical with that of the latch circuits 10A which is shown in FIG. 2. Therefore, only the operation which relates to the data holding mode switching signal KP and the inverted data holding mode switching signal KPB will be especially described.

First, the operation in the active mode where the sleep mode switching signal SL (SL="0") with the low potential and the inverted sleep mode switching signal SLB (SLB="1") with the high potential are applied will be described.

The data signal D passes through the transfer gate TM3 in the conductive state in the active mode, is taken in by the transfer gate TM1 at the timing of the clock signal $\phi$ and the inverted clock signal $*\phi$ which are supplied to the transfer gate TM1 and then is sent out to the inverter circuit INV1. The inverter circuit INV1 in the active state takes in the data signal from the transfer gate TM1 and sends out this signal to the input side of the inverter circuit INV2 and the output side of the inverter circuit INV4, respectively. In the active mode, a data holding mode switching signal KP (KP="0") with the low potential and the inverted data holding mode switching signal KPB (KPB="1") with the high potential are applied to the inverter circuit INV4 in this case. As a result, the inverter circuit INV4 is set to the non-active state. Therefore, the interference and the competition with the data signal sent out by the inverter circuit INV1 with the output of the inverter circuit INV4 can be avoided because of the existence of the inverter circuit INV4 in the non-active state.

Next, the operation in a period from the time when the operation mode is switched from the active mode (SL="0" and SLB="1") to the sleep mode (SL="1" and SLB="0") to the time when operation mode is switched from the sleep mode to the active mode through the sleep mode is set will be described.

In the above-mentioned period, the data holding mode switching signal KP (KP="1") with the high potential and the inverted data holding mode switching signal KPB (KPB="0") with the low potential are fixed on the applied state in previous, and the inverter circuit INV4 is set to the active state. Therefore, the internal state of the latch circuit 10 is never destroyed because the data can be held in the bistable circuit which is composed of the inverter circuit INV4 and the inverter circuit INV2.

Next, the semiconductor integrated logic circuit with the latch circuit as the sequential circuit which has the information holding function at the time of the sleep mode according to the sixth embodiment of the present invention will be described below.

Figure 9:
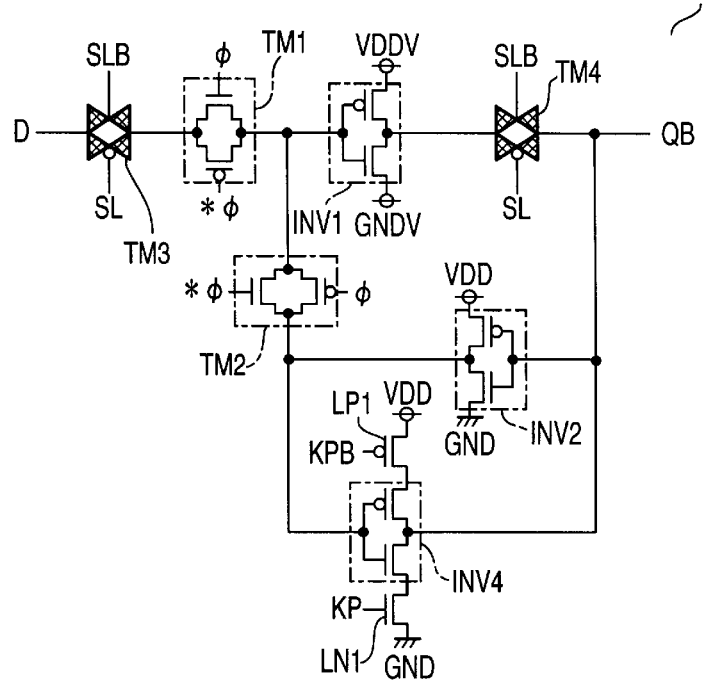
FIG. 9 is a circuit diagram illustrating the structure of the sequential circuit according to the sixth embodiment of the present invention.
Figure 10:
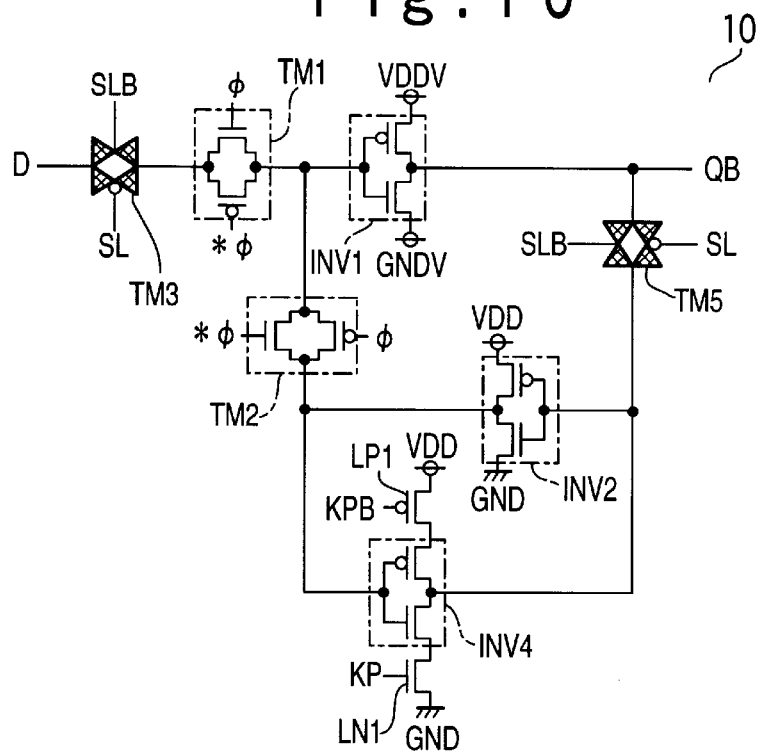
FIG. 10 is a circuit diagram illustrating the structure of the sequential circuit according to the sixth embodiment of the present invention.

FIG. 9 is a circuit diagram illustrating the structure of the latch circuit as the sequential circuit according to the sixth embodiment of the present invention. FIG. 10 is a circuit diagram illustrating the structures of a modification of the latch circuit as the sequential circuit according to the sixth embodiment of the present invention.

Referring to FIG. 9 and FIG. 10, the latch circuits 10 in the sixth embodiment basically have the same structures as those of the latch circuits 10 shown in FIG. 6 and FIG. 7, respectively. The difference point between them is as follows. That is, the bistable circuit section is composed of the inverter circuit INV2 and the inverter circuit INV4 as shown in FIG. 9 or FIG. 10, in place of the inverter circuits INV2 and INV3 of the latch circuit 10 shown in FIG. 6 or FIG. 7. Thus, the latch circuits 10 as the sequential circuit according to the sixth embodiment of the present invention shown in FIG. 9 and FIG. 10 perform the data holding operation in the sleep mode by the bistable circuit section.

Figure 11:
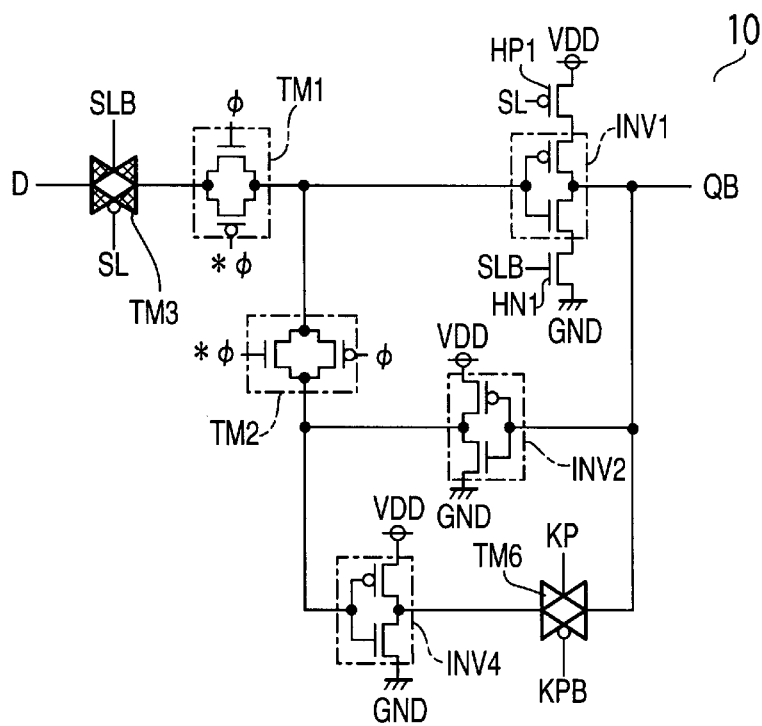
FIG. 11 is a circuit diagram illustrating the structure of the sequential circuit according to the seventh embodiment of the present invention.

Next, the semiconductor integrated logic circuit with the latch circuit as the sequential circuit which has the information holding function at the time of the sleep mode according to the seventh embodiment of the present invention will be described below. FIG. 11 is a circuit diagram illustrating the structure of the latch circuit 10 as the sequential circuit according to the seventh embodiment of the present invention.

Referring to FIG. 11, the latch circuit as the sequential circuit according to the seventh embodiment of the present invention shown in FIG. 11 is a modification example of the latch circuit in the third embodiment shown in FIG. 8. The latch circuit in the seventh embodiment has the same structure as the latch circuit shown in FIG. 8. The difference points between them are as follows. That is, the power supply is performed directly from higher potential side actual power supply line VDD and the lower potential side actual power supply line GND to the inverter circuit INV4 of the latch circuit shown in FIG. 8. Also, the transfer gate TM6 which is composed of transistors with the high threshold values is inserted immediately behind the inverter circuit INV4.

In FIG. 11, the signals which controls the opening and closing operation of the transfer gate TM6 is synchronized with the data holding mode switching signal KP and the inverted data holding mode signal KPB which is the inverted signal of the data holding mode switching signal KP. That is, the data holding mode switching signal KP (KP="1") with the high potential and the inverted data holding mode switching signal KPB (KPB="0") with the low potential are applied to the transfer gate TM6 to set the transfer gate TM6 to the conductive state. Also, the data holding mode switching signal KP (KP="0") with the low potential and the inverted data holding mode switching signal KPB (KPB="1") with the high potential are applied to the transfer gate TM6 to set to the transfer gate TM6 to the non-conductive state.

The operation of the latch circuit 10 according to the seventh embodiment of the present invention shown in FIG. 11 will be described with reference to FIGS. 3A to 3E. The basic operation of the latch circuit 10 in the seventh embodiment is identical with that of the latch circuit shown in FIG. 8. Therefore, only the operation which relates to the data holding mode switching signal KP and the inverted data holding mode switching signal KPB will be especially described.

First, the operation in the active mode in which the sleep mode switching signal SL (SL="0") with the low potential and the inverted sleep mode signal SLB (SLB="1") with the high potential are applied will be described.

The data signal D passes through the transfer gate TM3 which is in the conductive state in the active mode, is taken in by the transfer gate TM1 at the timing of the clock signal φ and the inverted clock signal *φ which are supplied to the transfer gate TM1 and then is sent out to the inverter circuit INV1. The inverter circuit INV1 in the active mode takes in the data signal from the transfer gate TM1 and sends out it to one of the electrodes of the transfer gate TM6, which have bidirectional characteristic, and the input side of the inverter circuit INV2. In the active mode, the data holding mode switching signal KP (KP="0") with the low potential and the inverted data holding mode switching signal KPB (KPB="1") with the high potential are applied to the transfer gate TM6 in this case. As a result, the transfer gate TM6 is set to the non-conductive state. Therefore, the interference and the competition between the data signals sent out by the inverter circuit INV1 and the inverter circuit INV4 can be avoided through the existence of the transfer gate TM6.

Next, the operation during the period from the time when the operation mode is switched from the active mode (SL="0" and SLB="1") to the sleep mode (SL="1" and SLB="0") to the time when the operation mode is switched from the sleep mode to the active mode through the sleep mode will be described.

In the above-mentioned period, the data holding mode switching signal KP (KP="1") with the high potential and the inverted data holding mode switching signal KPB (KPB="0") with the low potential are applied to the transfer gate TM6 to set the transfer gate TM6 to the conductive state. Also, the data signal can be held by the bistable circuit section which is composed of the inverter circuits INV2 and INV4 and the transfer gate TM6. Therefore, the internal state of the latch circuit is never destroyed.

Next, the semiconductor integrated logic circuit with the latch circuit as the sequential circuit which has the information holding function at the time of the sleep mode according to the eighth embodiment of the present invention will be described.

Figure 12:
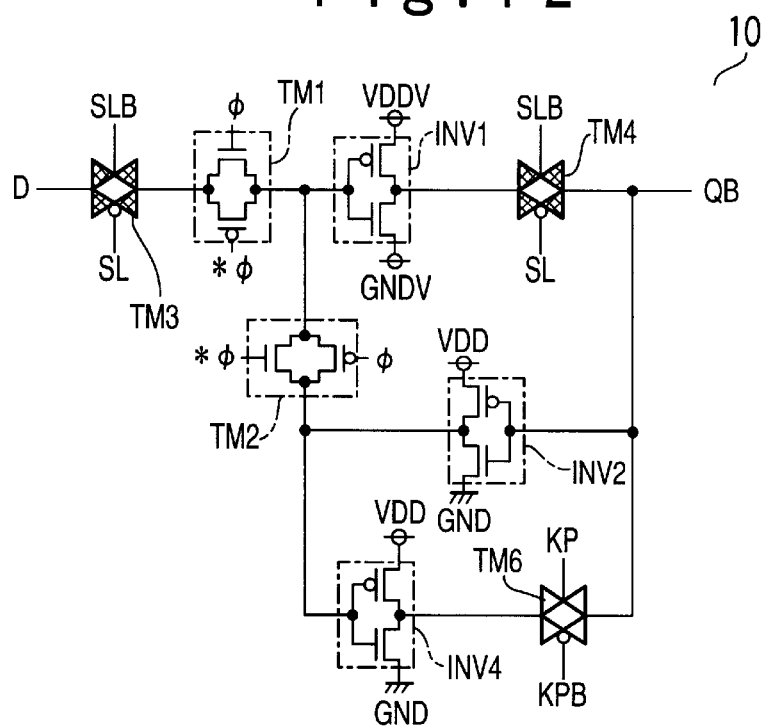
FIG. 12 is a circuit diagram illustrating the structure of the sequential circuit according to the eighth embodiment of the present invention.
Figure 13:
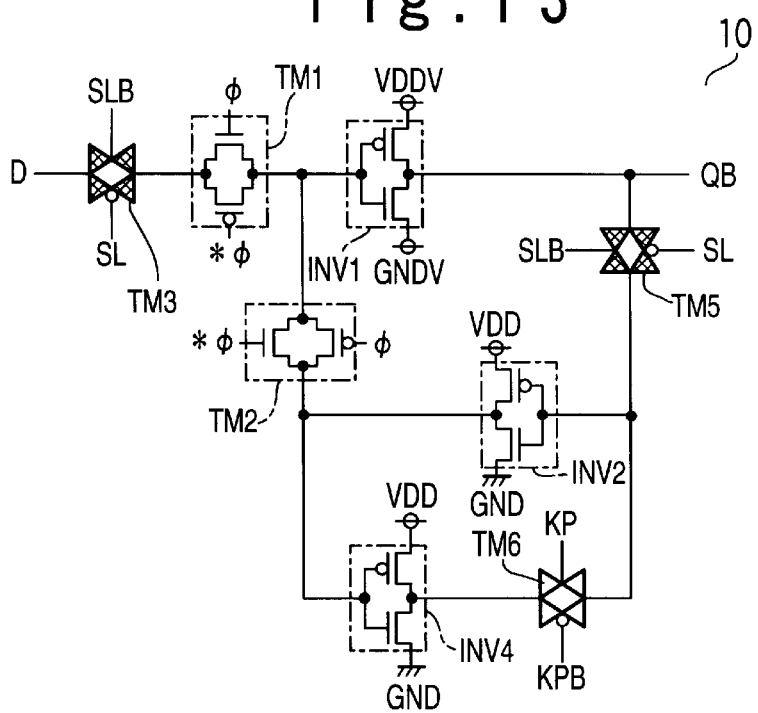
FIG. 13 is a circuit diagram illustrating the structure of a modification of the sequential circuit according to the eighth embodiment of the present invention.

FIG. 12 is a circuit diagram illustrating the structure of the latch circuit 10 as the sequential circuit according to the eighth embodiment of the present invention. FIG. 13 is a circuit diagram illustrating the structures of a modification of the latch circuit 10 as the sequential circuit according to the eighth embodiment of the present invention.

The latch circuits 10 as the sequential circuits according to the eighth embodiment of the present invention shown in FIG. 12 and FIG. 13 are modification examples of the third embodiment shown in FIG. 9 and FIG. 10. The transfer gate TM2 is composed of transistors with the high threshold value in the latch circuit shown in FIG. 12 and FIG. 13. The transfer gate TM2 is connected between the input side of the inverter circuit INV1 as the second node and the output side of the inverter circuit INV2. Also, the transfer gate TM6 is composed of transistors with the high threshold value is connected between the input side of the inverter circuit INV2 as the third node and the output side of the inverter circuit INV4. Also, the inverter circuit INV4 is connected directly to the higher potential side actual power supply line VDD and the lower potential side actual power supply line GND.

Referring to FIG. 12 and FIG. 13, the signal which controls the opening and closing operation of the transfer gate TM6 is synchronized with the data holding mode switching signal KP and the inverted data holding mode switching signal KPB, which is the inverted signal of the data holding mode switching signal KP. That is, the data holding mode switching signal KP (KP="1") with high potential and the inverted data holding mode switching signal KPB (KPB="0") with the low potential are applied to the transfer gate TM6 to set the transfer gate TM6 to the conductive state. Also, the data holding mode switching signal KP (KP="0") with the low potential and the inverted data holding mode signal KPB (KPB="1") with the high potential are applied to the transfer gate TM6 to set the transfer gate TM6 to the non-conductive state.

Figure 14:
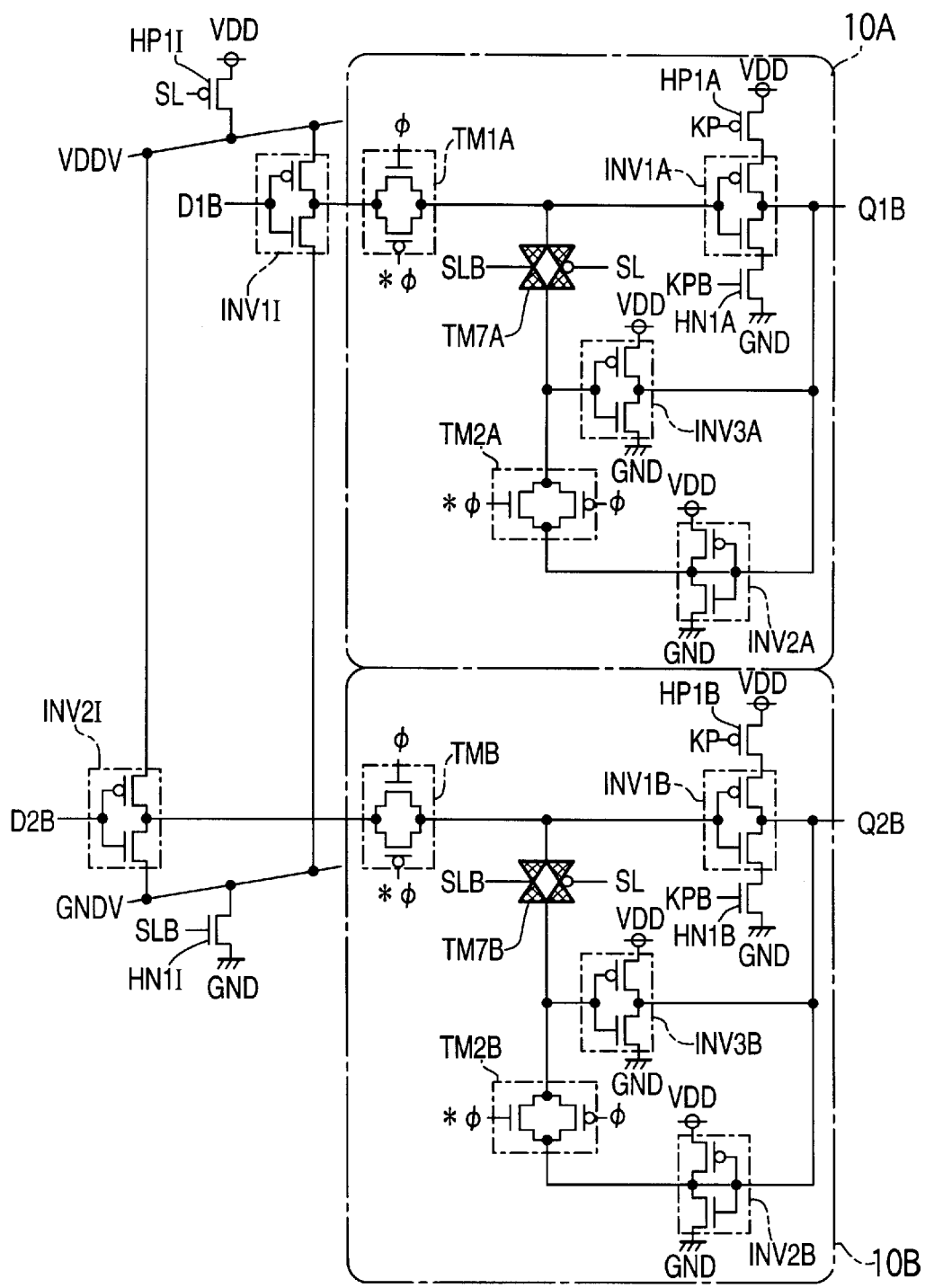
FIG. 14 is a circuit diagram illustrating the structure of the sequential circuit according to the ninth embodiment of the present invention.

Next, the semiconductor integrated logic circuit with the latch circuit 10 as the sequential circuit according to the ninth embodiment of the present invention will be described below. FIG. 14 is a circuit diagram illustrating the structure of the latch circuit as the sequential circuit according to the ninth embodiment of the present invention.

Referring to FIG. 14, the control transistor HP1I is composed of a p-channel type MOSFET with the high threshold value. The control transistor HP1I is connected with the higher potential side actual power supply line VDD at the source electrode and with the higher potential side quasi power supply line VDDV at the drain electrode. Moreover, the electric connection between the higher potential side actual power supply line and the quasi power supply line is controlled to be in the conductive state or the blocking-off state in response to the sleep mode switching signal SL applied to the gate electrode of the control transistor HP1I.

Also, the control transistor HN1I is composed of an n-channel type MOSFET with the high threshold value. The control transistor HN1I is connected with the lower potential side actual power supply GND at the source electrode and with the lower potential side quasi power supply GNDV at the drain electrode. Moreover, the electric connection between the lower potential side actual power supply line and the lower potential side quasi power supply line is controlled to be in the conductive state or the blocking-off state in response to the inverted sleep mode switching signal SLB applied to the gate electrode of the control transistor HN1I. In this case, the inverted sleep mode signal SLB is the signal which is obtained by inverting the sleep mode switching signal SL and is sent out from the sleep mode control circuit (not shown).

The CMOS logic circuit is a lower threshold type and is composed of the inverter circuits INV1I and INV2I to perform the buffering operations of the data signals D1B and D2B which are supplied to the latch circuits 10A and 10B, respectively.

The inverter circuit INV1I is composed of an n-channel type MOSFET as the lower threshold type transistor and a p-channel type MOSFET as the lower threshold type transistor. The gate electrodes of both the transistors are connected in common to input the data signal D1B, and the drain electrodes of both the transistors are connected in common to function as the output terminal.

The inverter circuit INV2I is composed of an n-channel type MOSFET as the lower threshold type transistor and a p-channel type MOSFET as the lower threshold type transistor. The gate electrodes of both the transistors are connected in common to input the data signal D2B, and the drain electrodes of both the transistors are connected in common to function as the output terminal.

Also, the source electrode of the p-channel type MOSFET with the lower threshold value of the inverter circuit INV1I is connected with the higher potential side quasi power supply line which supplies the higher potential side quasi power supply voltage VDDV through the drain electrode of the control transistor HP1I. The source electrode of the n-channel type MOSFET with the lower threshold value of the inverter circuit INV1I is connected with the lower potential side quasi power supply line which supplies the lower potential side quasi power supply voltage GNDV through the drain electrode of the control transistor HN1I.

The structures of the latch circuits 10A and 10B as the sequential circuits which has the information holding function at the time of the sleep mode according to the ninth embodiment of the present invention shown in FIG. 14 will be described.

The latch circuits 10A is composed of three transfer gates TM1A, TM2A, TM7A and three inverter circuits INV1A, INV2A and INV3A.

The transfer gate TM1A is composed of an n-channel type MOSFET as the lower threshold type transistor and a p-channel type MOSFET as the lower threshold type transistor. The source electrode and the drain electrode of the transistors are alternately connected in parallel. One of electrodes of the transfer gate TM1A having a bidirectional characteristic is connected with the output side of the inverter circuit INV1I as the first node and the other electrode is connected with the input side of the inverter circuit INV1A as the second node. Moreover, the clock signal φ is applied to the gate electrode of the n-channel type MOSFET as the lower threshold type transistor of the transfer gate TM1A, and the inverted clock signal which is the inverted signal of the clock signal 4 is applied to the gate electrode of the p-channel type MOSFET as the lower threshold type transistor.

Also, the transfer gate TM7A is composed of the transistor which is composed of a MOSFET with the high threshold value. One of the electrodes of the transfer gate TM7A having the bidirectional characteristic is connected with the input side of the inverter circuit INV1A. The other electrode of the transfer gate TM7A is connected with one of the electrodes of the transfer gate TM2A having the bidirectional characteristic.

Also, the signal which controls the opening and closing operation of the transfer gate TM7A is synchronized with the sleep mode switching signal SL and the inverted sleep mode switching signal SLB which is the inverted signal of the sleep mode switching signal SL. That is, in the sleep mode, the sleep mode switching signal SL (SL="1") with the high potential and the inverted sleep mode switching signal SLB (SLB="0") with the low potential are applied to the transfer gate TM7A to set the transfer gate TM7A to the non-conductive state. Also, in the active mode, the sleep mode switching signal SL (SL="0") with low potential and the inverted sleep mode switching signal SLB (SLB="1") with the high potential are applied to the transfer gate TM7A to set the transfer gate TM7A to the conductive state.

The transfer gate TM2A have the same structure as the transfer gate TM1A. On of the electrode of the transfer gate TM2A having the bidirectional characteristic is connected with the input side of the inverter circuit INV3A and the other electrode is connected with the output side of the inverter circuit INV2A. It should be noted that each of the transistors of the transfer gate TM2A may be a transistors of a MOSFET with a lower threshold value or a MOSFET with a high threshold value.

The inverter circuits INV1A, INV2A and INV3A have the same structure as those of the inverter circuits INV1I and INV2I. Each of the transistors of the inverter circuit INV1A is an MOSFET with a lower threshold value, and each of transistors of the other inverter circuits INV and INV3A is a transistor of the high threshold value MOSFET.

The control transistor HP1A is composed of a p-channel type MOSFET with the high threshold value and is connected with the higher potential side actual power supply line VDD at the source electrode. The electric connection with the drain electrode is controlled to be in the conductive state or the blocking-off state in response to the data holding mode switching signal KP which is applied to the gate electrode.

The control transistor HN1A is composed of an n-channel type MOSFET with the high threshold value and is connected to the lower potential side actual power supply line GND at the source electrode. The electric connection with the drain electrode is controlled to be in the conductive state or the blocking-off state in response to the inverted data holding mode switching signal KPB which is applied to the gate electrode.

The source electrode of the p-channel type MOSFET with the lower threshold value of the inverter circuit INV1A is connected with the drain electrode of the control transistor HP1A. Also, the source electrode of the n-channel type MOSFET with the lower threshold value of the inverter circuit INV1A is connected with the drain electrode of the control transistor HN1A.

In this case, the inverter circuit INV3A is different from the inverter circuit INV1A in that the inverter circuit INV3A receives the power supply directly from the higher potential side actual power supply line VDD and the lower potential side actual power supply line GND. The inverter circuit INV3A receives the power supply without passing though the control transistor such as the control transistor HP1A and the control transistor HN1A.

Each of the output sides of the inverter circuit INV1A and the inverter circuit INV3A is connected in common to the third node as the output terminal of the latch circuits 10A to send out latch output signal Q1B to the subsequent stage of the circuit.

In the latch circuits 10A, the output sides of the inverter circuit INV1A and INV3A which are connected in common are connected with the input side of the inverter circuit INV2A. In this case, like the inverter circuit INV3A, the inverter circuit INV2A is composed of the transistors which are composed of two MOSFETs with the high threshold values. Moreover, the inverter circuit INV2A receives the power supply directly from the higher potential side actual power supply line VDD and the lower potential side actual power supply line GND.

The latch circuit 10B has the same structure as the latch circuits 10A except that the data signal D2B which is inverted by the inverter circuit INV2I is supplied and moreover the output of the latch circuit is the signal Q2B.

The operation of the latch circuits 10A as the sequential circuit which has the information holding function at the time of the sleep mode according to the ninth embodiment of the present invention shown in FIG. 14 will be described with reference to FIGS. 3A to 3E.

First, the operation in the active mode in which the sleep mode switching signal SL (SL="0") with the low potential and the inverted sleep mode switching signal SLB (SLB="1") with the high potential are applied will be described.

The control transistor HP1A and HN1A are set to the conductive state in the usual mode to perform the voltage supply from the higher potential side actual power supply line and the lower potential side actual power supply line to the inverter circuit INV1A, so that the inverter circuit INV1A is set to the active state. Also, the transfer gate TM7A is set to the conductive state such that it is possible to send out the data signal from the transfer gate TM1A to the inverter circuit INV3A.

In the active mode, the data signal D1B which has been inverted by the inverter circuit INV1I and has been supplied to the latch circuits 10A is taken in by the transfer gate TM1A at the timing of the clock signal $\phi$ and the inverted clock signal $*\phi$ which are supplied to the transfer gate TM1A, and is sent out to the inverter circuit INV1A and the inverter circuit INV3A through the transfer gate TM7A. The inverter circuit INV1A is set to the active state in response to the data holding mode switching signal KP and the inverted data holding mode switching signal KPB so that it is possible to taken in the data signal from the transfer gate TM1A.

The output of the inverter circuit INV1A is sent out to the subsequent stage of the circuit as the output signal Q1B of the latch circuit 10A and is sent out to the inverter circuit INV2A. Moreover, the output of the inverter circuit INV2A is sent out to the transfer gate TM2A. The transfer gate TM2A feeds back the output signal of the inverter circuit INV2A to the input side of the inverter circuit INV3A and the input side of the inverter circuit INV1A through the transfer gate TM7A at the timing of the clock signal $\phi$ and the inverted clock signal $*\phi$, and performs the latching operation of the taken data signal.

Next, the sleep mode in which the sleep mode switching signal SL (SL="1") with the high potential and the inverted sleep mode switching signal SLB (SLB="0") with the low potential are applied will be described.

In the sleep mode, the control transistors HP1A and HN1A are set to the non-conductive state, so that the voltage supplies from the higher potential side actual power supply line and the lower potential side actual power supply line to the inverter circuit INV1A are stopped. As a result, the inverter circuit INV1A is set to the non-active state.

Also, the transfer gate TM7A is set to the non-conductive state so that the transfer gate TM7A is set to the state in which the data signal which is transmitted from the front stage of the circuit through the transfer gate TM1A can be blocked off. In this case, if the state in which the clock signal $\phi$ ($\phi$="0") with the low potential and the inverted clock signal $*\phi$ ($*\phi$="1") with the high potential are applied is previously fixed, and the operation mode is switched from the active mode to the sleep mode (SL="1" and SLB="0"), the internal state of the latch circuit is never destroyed because the data is held by the bistable circuit which is composed of the inverter circuit INV3A, the inverter circuit INV2A and the transfer gate TM2A in the conductive state.

The effect according to the ninth embodiment of the present invention shown in FIG. 14 will be described.

In FIG. 14, when the sleep mode switching signal SL (SL="1") with the high potential and the inverted sleep mode switching SLB (SLB="0") signal with the low potential are applied, that is, in the sleep mode, the control transistors HP1I and HN1I, and the control transistors HP1A and HN1A are set to blocking-off state. Therefore, because the inverter circuit INV1A is supplied with the power through the control transistors HP1A and HN1A, the inverter circuit INV1A is in the blocking-off state. Therefore, in the sleep mode (SL="1" and SLB="0"), there is not increase of the power consumption due to the sub-threshold leakage current.

It should be noted that the inverter circuits INV2A and INV3A are directly supplied with the power. However, since the inverter circuits INV2A and INV3A are composed of transistors with the high threshold value, there is not increase of the power consumption due to the sub-threshold leakage current, in the stationary state.

Figure 1:
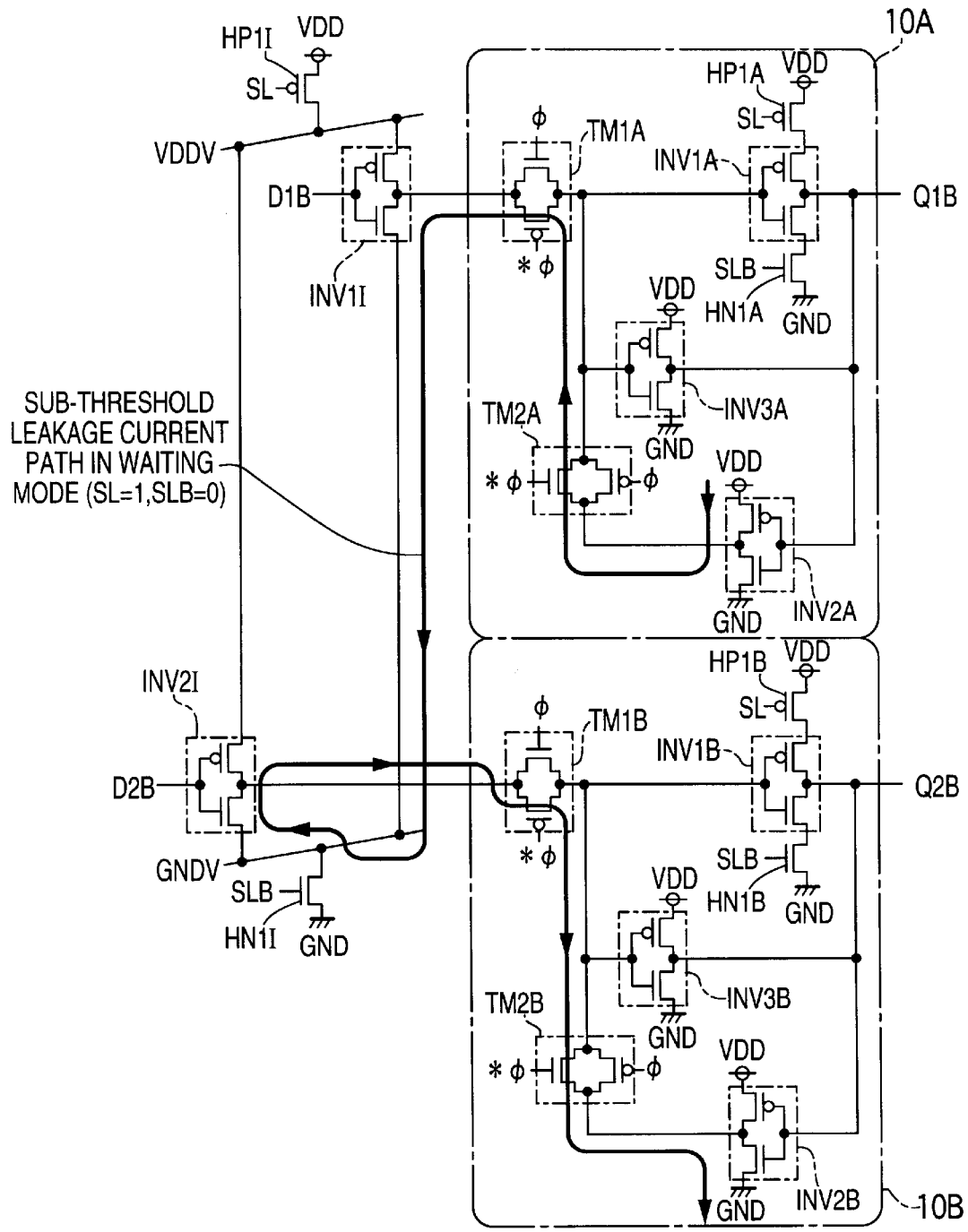
FIG. 1 is a circuit diagram illustrating the structure of a conventional example of a sequential circuit.

Next, let's consider the condition when the sub-threshold leakage current increases power consumption at the conventional sequential circuit shown in FIG. 1. It is supposed that the condition is applied to the sequential circuit having the information holding function at the time of the sleep mode according to the ninth embodiment of the present invention shown in FIG. 14. In this case, it will be proved that the increase of the power consumption due to the sub-threshold leakage current does not occur.

In the sequential circuit according to the ninth embodiment of the present invention shown in FIG. 14, the following matters are supposed. That is, the state in which the clock signal φ (φ="0") with the low potential and the inverted clock signal *φ (*φ="1") with the high potential are applied is previously fixed. Also, in the data holding states of the latch circuits 10A and 10B at that time, the output of the inverter circuit INV2A is in the state of "1" (therefore, the output of the inverter circuit INV3A is in the state of "0"), and the output of the inverter circuit INV2B is in the state of "0" (therefore, the output of the inverter circuit INV3B is in the state of "1"). In addition, the operation mode is switched to the sleep mode (SL="1" and SLBn="0").

In the semiconductor integrated logic circuit shown in FIG. 1 in case of the above-mentioned state, the DC current which is caused by the sub-threshold leakage current flows out along the current route shown by the thick arrow ling from the higher potential side actual power supply line VDD to the lower potential side actual power supply line GND.

On the other hand, in the semiconductor integrated logic circuit according to the ninth embodiment of the present invention shown in FIG. 14 in case of the above-mentioned state, the inverter circuit INV2A having the input in the state of "0" and the output in the state of "1" can function as the supply source of the leakage current. In this case, the leakage current is possible to pass through the transfer gate TM2A in the conductive state. However, in the ninth embodiment of the present invention shown in FIG. 14, even if the leakage current passes through the transfer gate TM2A in the conductive state, the leakage current is blocked off by the transfer gate TM7A which does not have the sub-threshold leakage current because it is composed of a transistor with the high threshold value in the non-conductive state. As a result, the leakage current never flows out from the latch circuits 10A to the other CMOS logic circuit.

Also, in the semiconductor integrated logic circuit according to the ninth embodiment of the present invention shown in FIG. 14 in case of above-mentioned state, the inverter circuit INV2B having the input in the state of "1" and the output in the state of "0" is possible to function as the demand source of the leakage current. In this case, the leakage current can pass through the transfer gate TM2B in the conductive state. However, in the ninth embodiment of the present invention shown in FIG. 14, even if the leakage current can pass through the transfer gate TM2B in the conductive state, the leakage current is prevented by the transfer gate TM7A which does not have the sub-threshold leakage current because it is composed of transistors with the high threshold value in the non-conductive state. As a result, the leakage current never flows out from the other CMOS logic circuit into the latch circuit 10B.

As described above, in the sequential circuit which has the information holding function at the time of the sleep mode according to the ninth embodiment of the present invention shown in FIG. 14, when there are two or more latch circuits 10A and 10B in the semiconductor integrated logic circuit, the problem can be solved that there is the increase of the power consumption due to the sub-threshold leakage current flowing through the control transistors such as the control transistors HP1I and HN1I which are composed of the p- and n-channel type MOSFETs with the high threshold value, and through the other CMOS logic circuit such as the inverter circuits INV1I and INV2I to which the power is supplied from the high potential side power supply and the lower potential side power supply.

The sequential circuit which has the information holding function at the time of the sleep mode according to the ninth embodiment of the present invention shown in FIG. 14 does not cause the increase of the power consumption due to the sub-threshold leakage current, as long as the sequential circuits exist independently in the semiconductor integrated logic circuit, off course.

Figure 15:
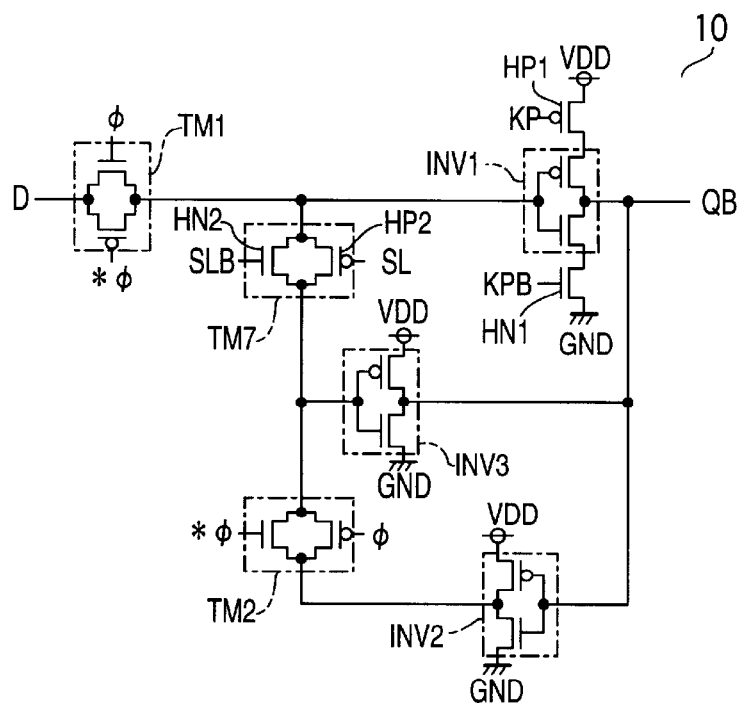
FIG. 15 is a circuit diagram illustrating the structure of the sequential circuit according to the tenth embodiment of the present invention.

Next, the semiconductor integrated logic circuit with the latch circuit as the sequential circuit which has the information holding function at the time of the sleep mode according to the tenth embodiment of the present invention. FIG. 15 is a circuit diagram illustrating the structure of the latch circuit as the sequential circuit according to the tenth embodiment of the present invention.

Referring to FIG. 15, the latch circuit according to the tenth embodiment of the present invention is composed of three transfer gates TM1, TM2, and TM7 and three inverter circuits INV1, INV2 and INV3. The latch circuit in the tenth embodiment is different from the latch circuit 10A which is shown in FIG. 14 in the following points. That is, the data signal D is supplied and the output of the latch circuit is a signal QB, and the transfer gate TM7A of the latch circuits 10A which is shown in FIG. 14 is composed of transistors.

Each of the transfer gates TM1, TM2 and the three inverter circuits INV1, INV2 and INV3 in the latch circuit according to the tenth embodiment of the present invention shown in FIG. 15 has the same structure as that of the corresponding one of the latch circuits 10A which are shown in FIG. 14.

The transfer gate TM7 in the tenth embodiment of the present invention shown in FIG. 15 is composed of the transistor HP2 which is composed of a p-channel type MOSFET with the high threshold value and the transistor HN2 which is composed of an n-channel type MOSFET with the high threshold value. The source electrodes and the drain electrodes of both the transistors are alternately connected in parallel. One of the electrodes of the transfer gate TM7 which has the bidirectional characteristic is connected with the input side of the inverter circuit INV1 and the other electrode is connected with one of the electrodes of the transfer gate TM2 which has the bidirectional characteristic.

Moreover, the inverted sleep mode switching signal SLB which is the inverted signal of the sleep mode switching signal SL is applied to the gate electrode of the transistor HN2 of the transfer gate TM7. Also, the sleep mode switching signal SL is applied to the gate electrode of the transistor HP2 of the transfer gate TM7.

In the sleep mode, the sleep mode switching signal SL (SL="1") with the high potential voltage VDD and the inverted sleep mode switching signal SLB (SLB="0") with the low potential voltage GND are applied to the transfer gate TM7 to set the transfer gate TM7 to the non-conductive state. Also, in the active mode, the sleep mode switching signal SL (SL="0") with the low potential voltage GND and the inverted sleep mode switching signal SLB (SLB="1") with the high potential voltage VDD are applied to the transfer gate TM7 to set the transfer gate TM7 to the conductive state. As a result, the opening and closing control of the transfer gate TM7 is performed.

Figure 16:
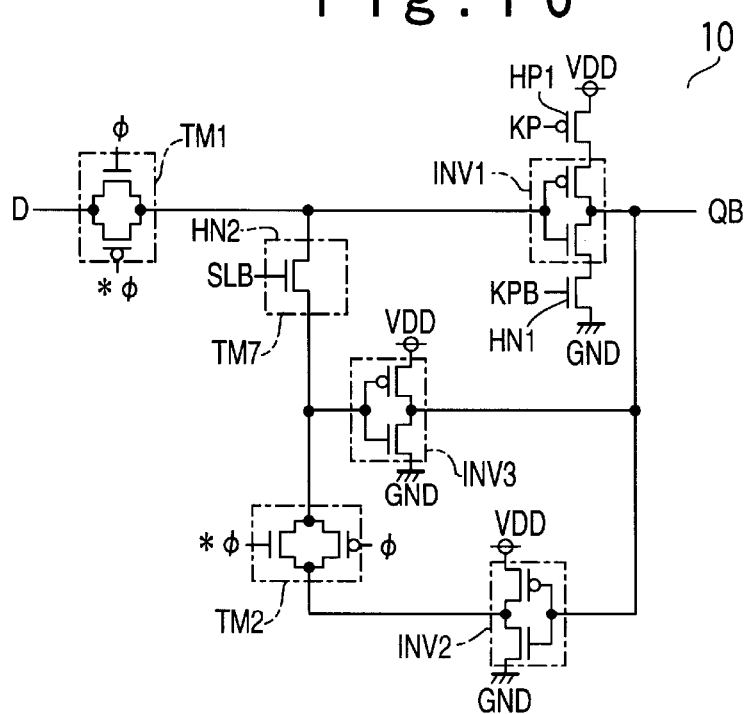
FIG. 16 is a circuit diagram illustrating the structure of the sequential circuit according to the eleventh embodiment of the present invention.

Next, the semiconductor integrated logic circuit with the latch circuit as the sequential circuit which has the information holding function at the time of the sleep mode according to the eleventh embodiment of the present invention will be described. FIG. 16 is a circuit diagram illustrating the structure of the latch circuit as the sequential circuit according to the eleventh embodiment of the present invention.

The latch circuit 10 according to the eleventh embodiment of the present invention shown in FIG. 16 is composed of three transfer gates TM1, TM2, and TM7 and three inverter circuits INV1, INV2 and INV3. The latch circuit 10 in the eleventh embodiment is different from the latch circuit 10A which is shown in FIG. 14 in the following points. That is, the data signal D is supplied and the output of the latch circuit is a signal QB, and also the transfer gate TM7A of the latch circuits 10A which is shown in FIG. 14 is composed of a single transistor.

The structure of each of the transfer gates TM1, TM2 and the three inverter circuits INV1, INV2 and INV3 in the latch circuit 10 according to the eleventh embodiment of the present invention shown in FIG. 16 has the same structure as that of the corresponding one of the latch circuits 10A which is shown in FIG. 14.

The transfer gate TM7 in the eleventh embodiment of the present invention shown in FIG. 16 is composed of a single transistor HN2 which is composed of an n-channel type MOSFET with the high threshold value. One of the source electrode and the drain electrode is connected with as the second node as the input side of the inverter circuit INV1 and the other electrode is connected with one of the electrodes of the transfer gate TM2 which has the bidirectional characteristic.

Moreover, the inverted sleep mode switching signal SLB which is the inverted signal of the sleep mode switching signal SL is applied to the gate electrode of the transistor HN2 which is composed of the n-channel type MOSFET with the high threshold value of the transfer gate TM7.

In the sleep mode, the inverted sleep mode switching signal SLB (SLB="0") with the low potential voltage GND is applied to the transfer gate TM7 to set the transfer gate TM7 to the non-conductive state. Also, in the active mode, the inverted sleep mode switching signal SLB (SLB="1") with the high potential voltage VDD is applied to the transfer gate TM7 to set the transfer gate TM7 to the conductive state. As a result, the opening and closing control of the transfer gate TM7 is performed.

Also, in the active mode, the signal voltage of the inverted sleep mode switching signal SLB (SLB="1") is set to be equal to the voltage of summation of the threshold value voltage of the transistor HN2 and the higher potential side voltage VDD. In this way, when the data signal D (D="1") with the high potential voltage VDD is transferred to the inverter circuit INV1 of the following stage through the transfer gate TM7, the same signal voltage, i.e., the voltage signal with high potential voltage VDD can be applied.

Figure 17:
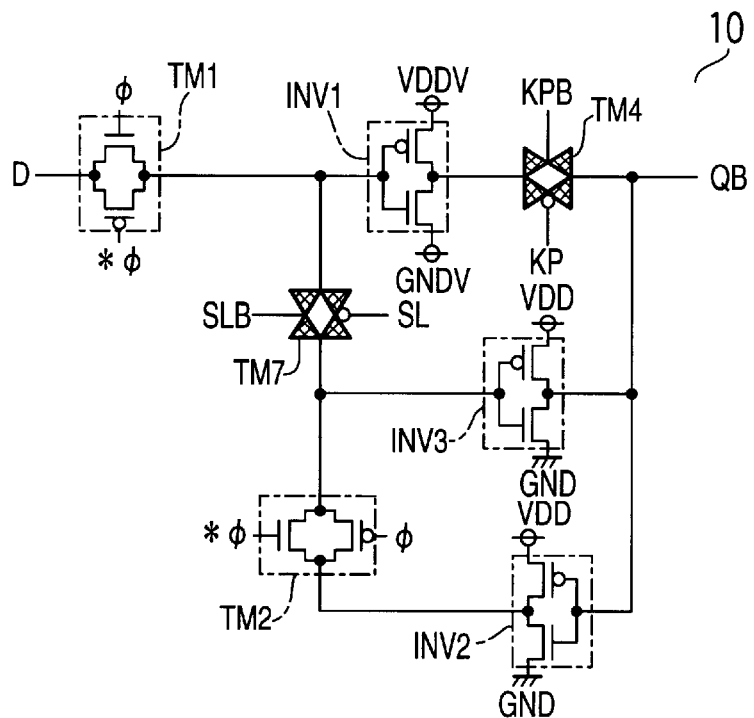
FIG. 17 is a circuit diagram illustrating the structure of the sequential circuit according to the twelfth embodiment of the present invention.
Figure 18:
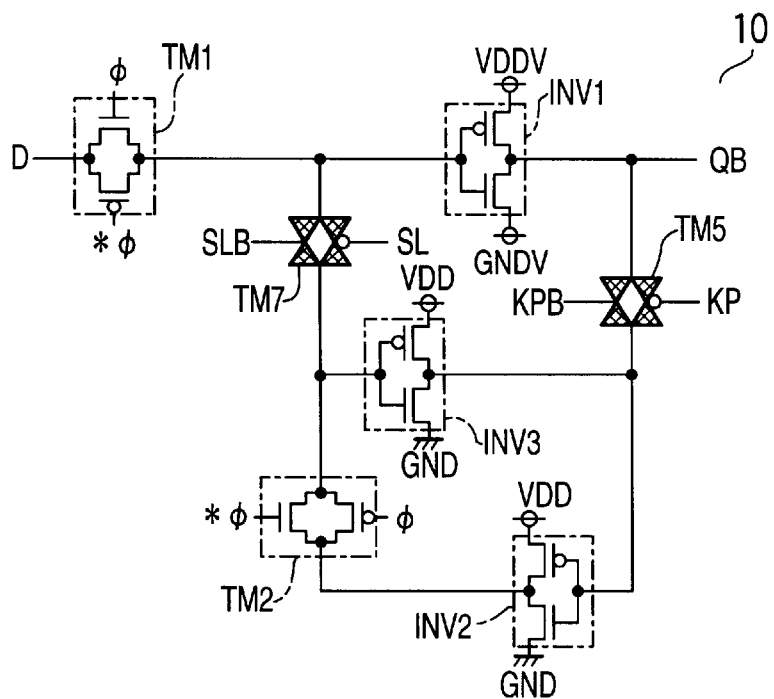
FIG. 18 is a circuit diagram illustrating the structure of a modification of the sequential circuit according to the twelfth embodiment of the present invention.

Next, the semiconductor integrated logic circuit with the latch circuits as the sequential circuit which has the information holding function at the time of the sleep mode according to the twelfth embodiment of the present invention. FIG. 17 is a circuit diagram illustrating the structure of the latch circuit as the sequential circuit according to the twelfth embodiment of the present invention. FIG. 18 is a circuit diagram illustrating the structure of a modification of the latch circuit as the sequential circuit according to the twelfth embodiment of the present invention.

The latch circuit of the twelfth embodiment of the present invention shown in FIG. 16 or FIG. 17 has the same structure as the latch circuits 10A shown in FIG. 14. The latch circuit in the twelfth embodiment is different from the latch circuits 10A shown in FIG. 14 in the following points. That is, the data signal D is supplied and the output of the latch circuit is a signal QB. Also, the inverter circuit INV1 receives the power supply directly from the higher potential side quasi power supply line VDDV and the lower potential side quasi power supply line GNDV, unlike the inverter circuit INV1A of the latch circuits 10A which is shown in FIG. 14. In addition, the transfer gate TM4 or TM5 which is composed of transistors with the high threshold value is connected between the outputs of the inverter circuits INV1 and INV3.

In the twelfth embodiment of the present invention shown in FIG. 17 and FIG. 18, the power is supplied from the higher potential side quasi power supply line VDDV and the lower potential side quasi power supply line GNDV to the inverter circuit INV1. Circuit for generating the voltages VDDV and GNDV has the same structures as those for generating the higher potential side quasi power supply voltage VDDV and lower potential side quasi power supply voltage GNDV shown in FIG. 14. That is, like the control transistors shown in FIG. 14, the control transistor HP1I is composed of a p-channel type MOSFET with the high threshold value. The control transistor HP1I controls the CMOS logic circuit including circuits such as the inverter circuits INV1I and INV2I which are composed of lower threshold type transistors. The control transistor HP1I is connected with the higher potential side actual power supply line VDD at the source electrode and with the higher potential side quasi power supply line VDDV at the drain electrode. Moreover, the electric connection between the higher potential side actual power supply line and the higher potential side quasi power supply line is controlled to be in the conductive state or the blocking-off state in response to the sleep mode switching signal SL applied to the gate electrode of the control transistor HP1I.

Also, the control transistor HN1I is composed of an n-channel type MOSFET with the high threshold value. The control transistor HN1I is connected to the lower potential side actual power supply line GND at the source electrode and the lower potential side quasi power supply line GNDV at the drain electrode. Moreover, the electric connection between the lower potential side actual power supply line and the lower potential side quasi power supply line is controlled to be in the conductive state or the blocking-off state in response to the inverted sleep mode switching signal SLB applied to the gate electrode of the control transistor HN1I.

Referring to FIG. 17 and FIG. 18, the power supply to the inverter circuit INV1 is performed from the higher potential side quasi power supply line and the lower potential side quasi power supply line. However, if the structure is adopted in which at least one of the power supply sources is the quasi power supply line, there is not the increase of the power consumption due to the sub-threshold leakage current which is caused by the inverter circuit INV1 which is composed of transistors with the lower threshold values and the large sub-threshold leakage in the sleep mode.

Also, in FIG. 17 and FIG. 18, the signal which controls the opening and closing operation of the transfer gate TM4 or TM5 is synchronizes with the sleep mode switching signal SL and the inverted sleep mode switching signal SLB which is the inverted signal of the sleep mode switching signal SL. That is, in the sleep mode, the sleep mode switching signal SL (SL="1") with the high potential and the inverted sleep mode switching signal SLB (SLB="0") with the low potential are applied to the transfer gate TM4 or TM5 to set the transfer gate TM4 or TM5 to the non-conductive state. Also, in the active mode, the sleep mode switching signal SL (SL="0") with the low potential and the inverted sleep mode switching signal SLB (SLB="1") with the high potential are applied to the transfer gate TM4 or TM5 to set the transfer gate TM4 or TM5 to the conductive state. Therefore, in the twelfth embodiment of the present invention shown in FIG. 17 and FIG. 18, the transfer gate TM4 or TM5 in the non-conductive state in the sleep mode (SL="1" and SLB="0") function to block off the DC current which is caused by the sub-threshold leakage.

When there is not the transfer gate TM4 or TM5, the inverter circuit INV3 is set to the supply source or the demand source of the leakage current. The leakage current passes through the inverter circuit INV1 which has a large sub-threshold leakage because it is composed of the lower threshold type transistors, passes through both of the higher potential side quasi power supply line and the lower potential side quasi power supply line which are set to the floating state in the sleep mode, and passes through the inverter circuit INV1 in another latch circuit in the semiconductor integrated logic circuit, and the inverter circuit INV3 functions as the supply source or the demand source of the leakage current. In this way, the leakage current route is formed between the higher potential side actual power supply line and the lower potential side actual power supply line for the DC current caused by the sub-threshold leakage to flow. Therefore, in the twelfth embodiment of the present invention shown in FIG. 17 and FIG. 18, the DC current which is caused by the sub-threshold leakage current is blocked off by the transfer gate TM4 or TM5 in the non-conductive state in the sleep mode (SL="1" and SLB="0").

Figure 19:
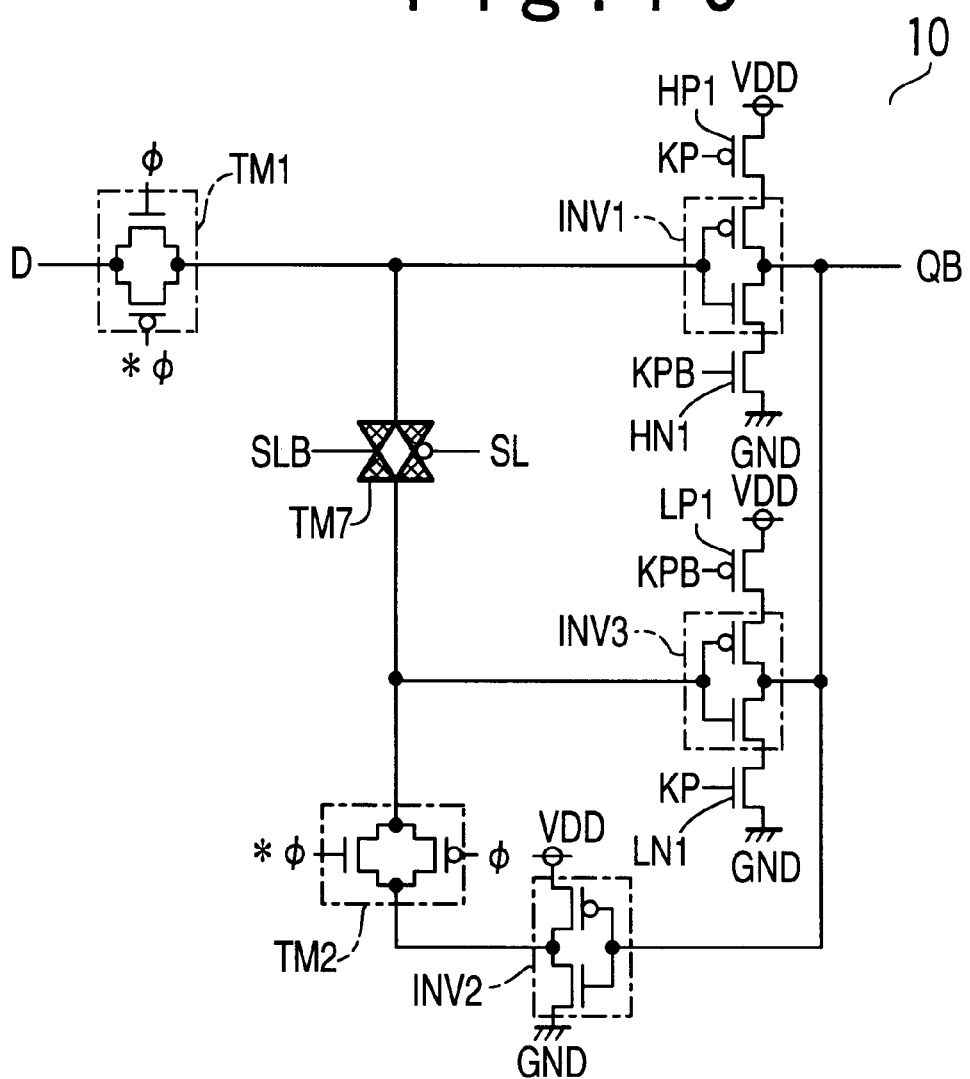
FIG. 19 is a circuit diagram illustrating the structure of the sequential circuit according to the thirteenth embodiment of the present invention.

Next, the semiconductor integrated logic circuit with the latch circuit as the sequential circuit which has the information holding function at the time of the sleep mode according to the thirteenth embodiment of the present invention will be described. FIG. 19 is a circuit diagram illustrating the structure of the latch circuit as the sequential circuit according to the thirteenth embodiment of the present invention.

Referring to FIG. 19, the latch circuit according to the thirteenth embodiment of the present invention has the same structure as the latch circuits 10A which is shown in FIG. 14. The latch circuit according to the thirteenth embodiment is different from the latch circuits 10A which is shown in FIG. 14 in the following points. That is, the data signal D is supplied and the output of the latch circuit is a signal QB. Also, the inverter circuit INV3A of the latch circuit 10A which is shown in FIG. 14 is supplied with the power supply through the transistors LP1 and LN1 with the high threshold values.

In FIG. 19, the control transistor LP1 is composed of a p-channel type MOSFET with the lower threshold value and is connected with the higher potential side actual power supply line VDD at the source electrode. The electric connection with the drain electrode is controlled to be in the conductive state or the blocking-off state in response to the inverted data holding mode switching signal KPB which is the inverted signal of the data holding mode switching signal KP and which is applied to the gate electrode. Also, the control transistor LN1 is composed of an n-channel type MOSFET with the lower threshold value and is connected to the lower potential side actual power supply GND at the source electrode. The electric connection with the drain electrode is controlled to be in the conductive state or the blocking-off state in response to the data holding mode switching signal KP applied to the gate electrode.

The source electrode of the p-channel type MOSFET with the high threshold value of the inverter circuit INV3 is connected with the drain electrode of the control transistor LP1. The source electrode of the n-channel type MOSFET with the lower threshold value of the inverter circuit INV4 is connected with the drain electrode of the control transistor LN1.

The operation of the latch circuit shown in FIG. 19 will be described with reference to FIGS. 3A to 3E. The basic operation is identical with that of the latch circuits 10A which is shown in FIG. 14. Therefore, the description will be especially given in relation to the data holding mode switching signal KP and the inverted data holding mode switching signal KPB.

First, the operation in the active mode will be described in which the sleep mode switching signal SL (SL="0") with the low potential and the inverted sleep mode signal SLB (SLB="1") with the high potential are applied.

In the active mode, the data signal D is taken in by the transfer gate TM1 at the timing of the clock signal φ and the inverted clock signal *φ which are supplied to the transfer gate TM1 and is sent out to the inverter circuit INV1. The inverter circuit INV1 in the active state takes the data signal therein from the transfer gate TM1. The data signal from the transfer gate TM1 is transferred to the input side of the inverter circuit INV3 through the transfer gate TM7 in the conductive state. However, in the active mode, the inverter circuit INV3 is in the non-active state, as long as the data holding mode switching signal KP (KP="0") with the low potential and the inverted data holding mode switching signal KPB (KPB="1") with the high potential are applied. Therefore, the inverter circuit INV3 never takes the data signal therein to send out from the output side. That is, the interference and competition between the output signals of the inverter circuits INV1 and INV3 can be avoided based on the signal delay difference by the transfer gate TM7 between the signal which is outputted from the inverter circuit INV1 based on the data signal from the transfer gate TM1 and the signal which is outputted from the inverter circuit INV3, and which is delayed by passing the data signal from the transfer gate TM1 through the transfer gate TM7.

Next, the operation will be described during a period from the time when the operation mode is changed from the active mode (SL="0" and SLB="1") to the sleep mode (SL="1" and SLB="0") to the time when the operation mode is changed from the sleep mode to the active mode through the sleep mode.

The state in which the data holding mode switching signal KP (KP="1") with the high potential and the inverted data holding mode switching signal KPB (KPB="0") are applied is fixed during the above-mentioned period, so that the inverter circuit INV3 is set to the active state. The internal state of the latch circuit is never destroyed because the data signal can be held in the bistable circuit section which is composed of the inverter circuit INV3 and the inverter circuit INV2, and the transfer gate TM2.

Figure 20:
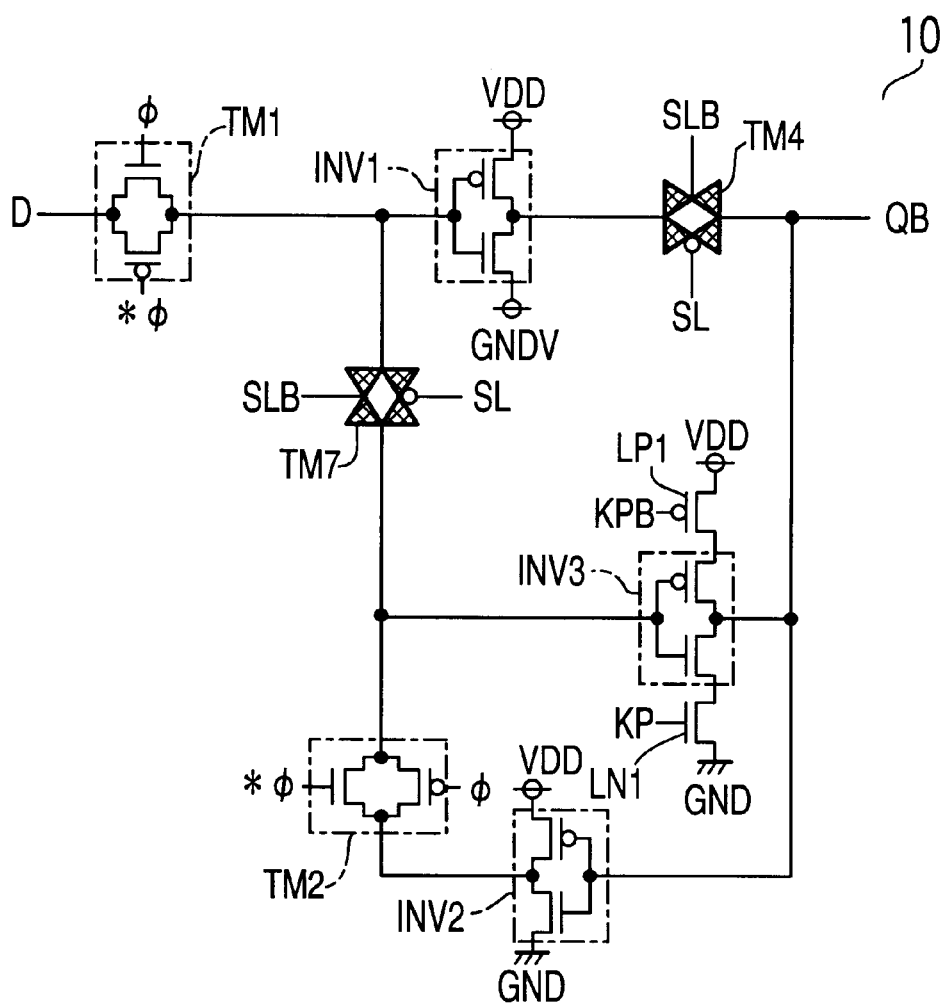
FIG. 20 is a circuit diagram illustrating the structure of the sequential circuit according to the fourteenth embodiment of the present invention.
Figure 21:
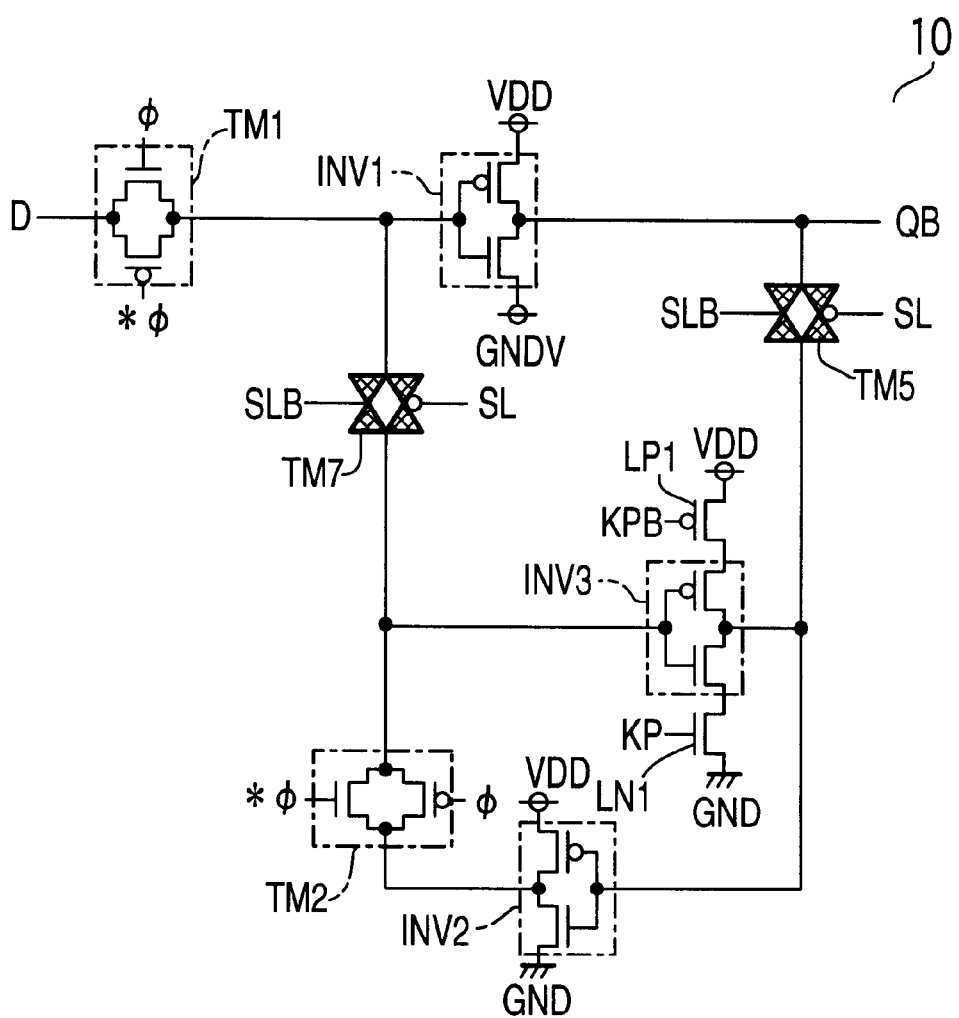
FIG. 21 is a circuit diagram illustrating the structure of a modification of the sequential circuit according to the fourteenth embodiment of the present invention.

Next, the semiconductor integrated logic circuit with the latch circuits as the sequential circuit which has the information holding function at the time of the sleep mode according to the fourteenth embodiment of the present invention will be described. FIG. 20 is a circuit diagram illustrating the structure of the latch circuit as the sequential circuit according to the fourteenth embodiment of the present invention. FIG. 21 is a circuit diagram illustrating the structure of a modification of the latch circuit as the sequential circuit according to the fourteenth embodiment of the present invention.

Referring to FIG. 20 and FIG. 21, the latch circuit according to the fourteenth embodiment of the present invention is a modification example of FIG. 17 or FIG. 18. The latch circuit according to the fourteenth embodiment is structured in such a manner that the voltage supply is performed from the high potential side actual power supply line VDD and the low voltage side actual power supply line GND to the inverter circuit INV3 through the control transistor LP1 and the control transistor LN1, respectively. The control transistor LP1 is composed of an p-channel type MOSFET with the lower threshold value and the control transistor LN1 is composed of an n-channel type MOSFET with the lower threshold value. The other structure has the same structure as that shown in FIG. 17 or FIG. 18.

Figure 22:
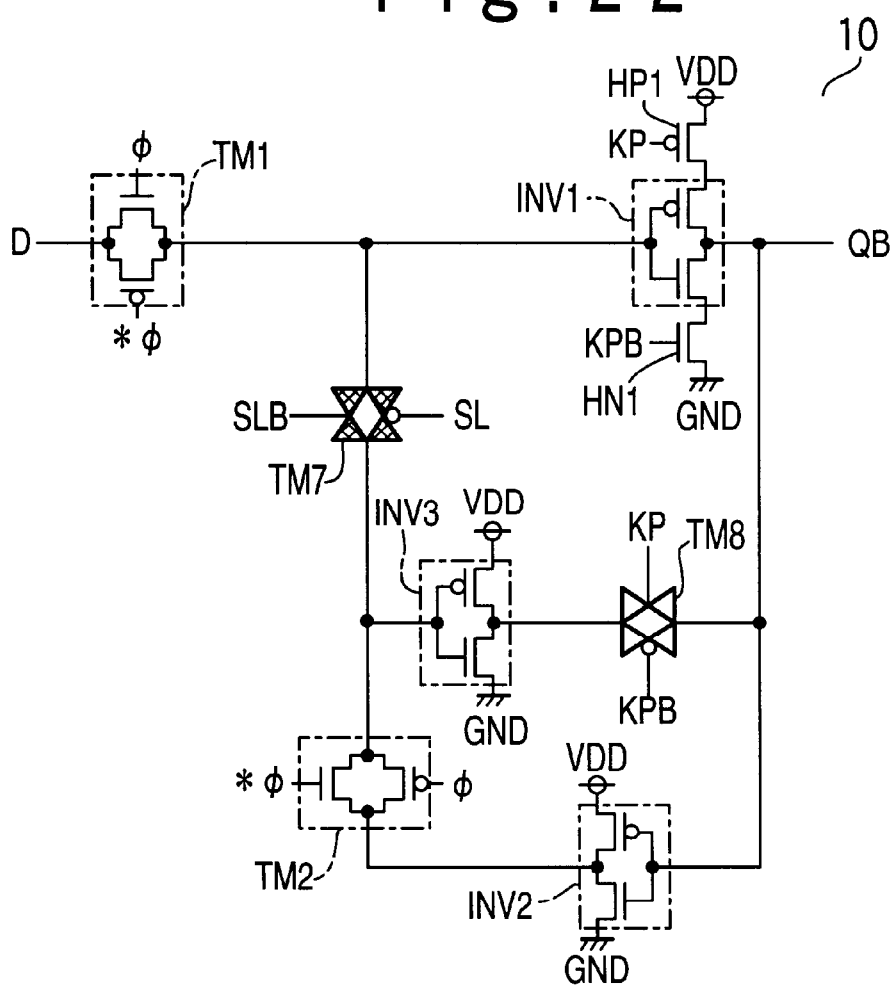
FIG. 22 is a circuit diagram illustrating the structure of the sequential circuit according to the fifteenth embodiment of the present invention.

Next, the semiconductor integrated logic circuit with the latch circuit as the sequential circuit which has the information holding function at the time of the sleep mode according to the fifteenth embodiment of the present invention will be described. FIG. 22 is a circuit diagram illustrating the structure of the latch circuit as the sequential circuit according to the fifteenth embodiment of the present invention.

Referring to FIG. 22, the latch circuit of the fifteenth embodiment of the present invention is a modification example of FIG. 19. The latch circuit of the fifteenth embodiment has the same structure as the latch circuit shown in FIG. 19. The latch circuit in the fifteenth embodiment is different from the latch circuit shown in FIG. 19 in the following points. That is, the power supply is performed directly from the higher potential side actual power supply line VDD and the lower potential side actual power supply line GND to the inverter circuit INV3. Also, the transfer gate TM8 is composed of transistors with the high threshold value and is connected immediately behind the output side of the inverter circuit INV3.

In FIG. 22, the signal which controls the opening and closing operation of the transfer gate TM8 is synchronized with the data holding mode switching signal KP and the inverted data holding mode switching signal KPB which is the inverted signal of the data holding mode switching signal KP. That is, the data holding mode switching signal KP (KP="1") with the high potential and the inverted data holding mode signal KPB (KPB="0") with the low potential are applied to the transfer gate TM8 to set the transfer gate TM8 to the conductive state. Also, the data holding mode switching signal KP (KP="0") with the low potential and the inverted data holding mode signal KPB (KPB="1") with the high potential are applied to the transfer gate TM8 to set the transfer gate TM8 to the non-conductive state.

The operation of the latch circuit according to the fifteenth embodiment of the present invention shown in FIG. 22 will be described with reference to FIGS. 3A to 3E. The basic operation is identical with that of the latch circuit shown in FIG. 19. Therefore, only the operation in relation to the data holding mode switching signal KP and the inverted data holding mode switching operation signal KPB will be especially described.

First, the operation in the active mode in which the sleep mode switching signal SL (SL="0") with the low potential and the inverted sleep mode switching signal SLB (SLB="1") with the high potential are applied will be described.

The data signal D is taken in by the transfer gate TM1 at the timing of the clock signal ϕ and the inverted clock signal *ϕ which are supplied to the transfer gate TM1 and is sent out to the inverter circuit INV1. The data signal from the transfer gate TM1 is taken in by the inverter circuit INV1 in the active state. Also, the data signal from the transfer gate TM1 is supplied to the inverter circuit INV3 through the transfer gate TM7 in the conductive state and is transferred to one of the electrodes of the transfer gate TM8 which has the bidirectional characteristic. However, the transfer gate TM8 is in the non-conductive state in the active mode as long as the data holding mode switching signal KP (KP="0") with the low potential and the inverted data holding mode switching signal KPB (KPB="1") with the high potential are applied. Therefore, the data signal is never transferred from the inverter circuit INV3. That is, the interference and competition between the output signals of the inverter circuits INV1 and INV3 can be avoided based on the signal delay difference by the transfer gate TM7 between the signal which is outputted from the inverter circuit INV1 based on the data signal from the transfer gate TM1 and the signal which the data signal from the transfer gate TM1 is delayed by the transfer gate TM7 and then is outputted from the inverter circuit INV3.

Next, the operation will be described of a period from the time when the operation mode is switched from the active mode (SL="0" and SLB="1") to the sleep mode (SL="1" and SLB="0") to the time when the operation mode is switched from the sleep mode to the active mode through the time of the sleep mode.

In the above-mentioned period, the state in which the data holding mode switching signal KP (KP="1") with the high potential and the inverted data holding mode switching signal KPB (KPB="0") with the low potential are applied is fixed to set the inverter circuit INV3 to the active state. At that time, because the data signal can be held in the bistable circuit which is composed of the inverter circuit INV3 and the inverter circuit INV2, the internal state of the latch circuit is never destroyed.

Figure 23:
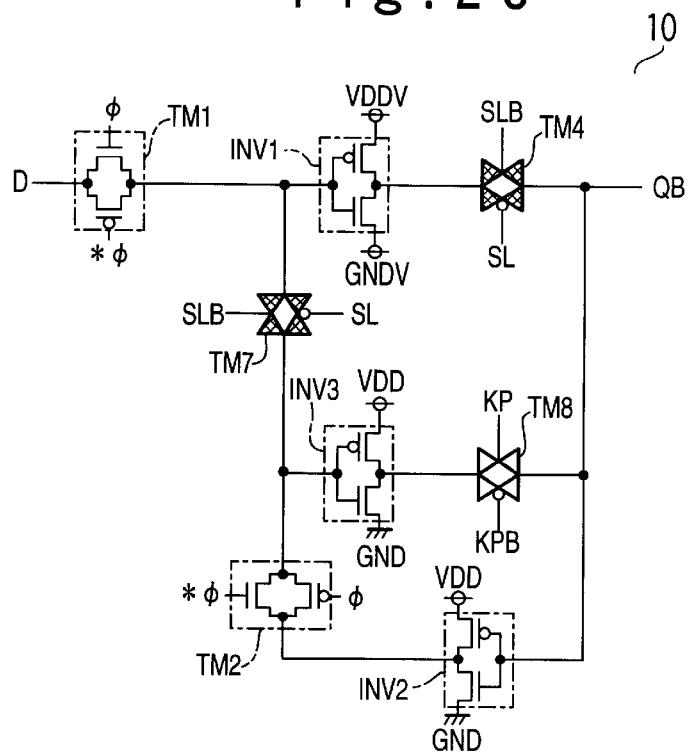
FIG. 23 is a circuit diagram illustrating the structure of the sequential circuit according to the sixteenth embodiment of the present invention.
Figure 24:
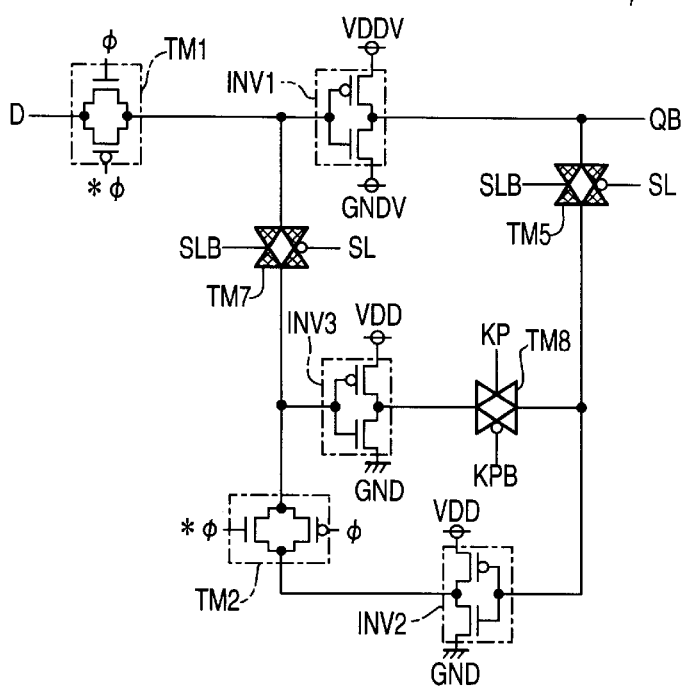
FIG. 24 is a circuit diagram illustrating the structure of a modification of the sequential circuit according to the sixteenth embodiment of the present invention.

Next, the semiconductor integrated logic circuit with the latch circuits as the sequential circuit which has the information holding function at the time of the sleep mode according to the sixteenth embodiment of the present invention will be described. FIG. 23 is a circuit diagrams illustrating the structures of the latch circuits as the sequential circuit according to the sixteenth embodiment of the present invention. FIG. 24 is a circuit diagrams illustrating the structures of a modification of the latch circuits as the sequential circuit according to the sixteenth embodiment of the present invention.

The latch circuit in the sixteenth embodiment of the present invention shown in FIG. 23 or FIG. 24 is a modification example of FIG. 17 and FIG. 18, and has the same structure as the latch circuit shown in FIG. 17 and FIG. 18. The latch circuit in the sixteenth embodiment is different from the latch circuit shown in FIG. 17 and FIG. 18 in the following points. That is, the transfer gate TM8 is composed of transistors with the high threshold value and is connected immediately behind the inverter circuit INV3.

In FIG. 23 and FIG. 24, the signal which controls the opening and closing operation of the transfer gate TM8 is synchronized with the data holding mode switching signal KP and the inverted data holding mode switching signal KPB which is the inverted signal of data holding mode switching signal KP. That is, the data holding mode switching signal KP (KP="1") with the high potential and the inverted data holding mode switching signal KPB (KPB="0") with the low potential are applied to the transfer gate TM8 to set the transfer gate TM8 to the conductive state. Also, the data holding mode switching signal KP (KP="0") with the low potential and the inverted data holding mode switching signal KPB (KPB="1") with the high potential are applied to the transfer gate TM8 to set the transfer gate TM8 to the non-conductive state.

Figure 25:
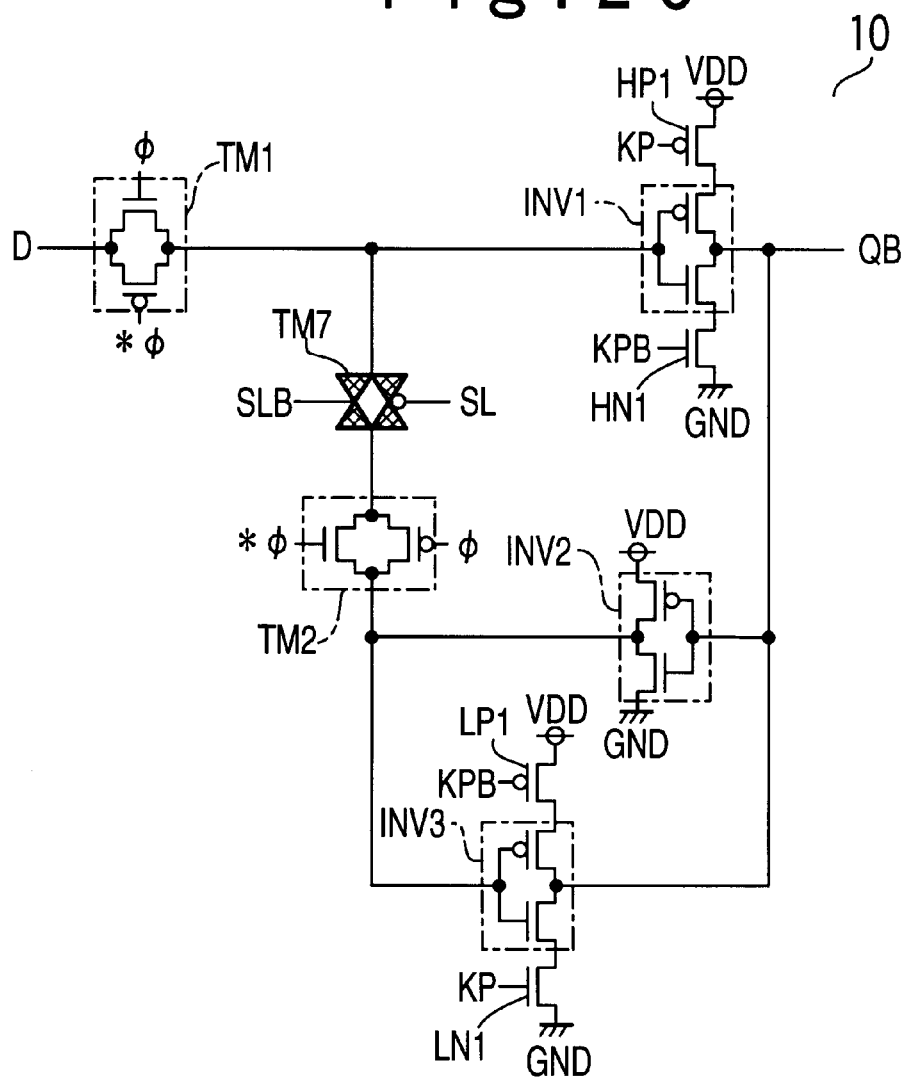
FIG. 25 is a circuit diagram illustrating the structure of the sequential circuit according to the seventeenth embodiment of the present invention.

Next, the semiconductor integrated logic circuit the latch circuit as the sequential circuit which has the information holding function at the time of the sleep mode according to the seventeenth embodiment of the present invention will be described below. FIG. 25 is a circuit diagram illustrating the structure of the latch circuit as the sequential circuit according to the seventeenth embodiment of the present invention.

Referring to FIG. 25, the latch circuit according to the seventeenth embodiment of the present invention has the same structure as the latch circuit 10A which is shown in FIG. 13. The latch circuit according to the seventeenth embodiment is different from the latch circuit 10A shown in FIG. 13 in the following points. That is, the data signal D is supplied and the output of the latch circuit is a signal QB. Also, the bistable circuit is composed of the inverter circuit INV2 and the inverter circuit INV4 in place of the inverter circuit INV3A of the latch circuits 10A which is shown in FIG. 13, so that the data holding operation is performed in the sleep mode.

Two control transistors LP1 and LN1 are connected with the source side and the drain side of the inverter circuit INV4 shown in FIG. 25, respectively. The control transistor LP1 is composed of a p-channel type MOSFET with the lower threshold value and is connected to the higher potential side actual power supply line VDD at the source electrode. The electric connection with the drain electrode is controlled to be in the conductive state or the blocking-off state in response to the inverted data holding mode switching signal KPB applied to the gate electrode of the control transistor LP1. The inverted data holding mode switching signal KPB is the inverted signal of the data holding mode switching signal KP. The control transistor LN1 is composed of an n-channel type MOSFET with the lower threshold value and is connected with the lower potential side actual power supply GND is supplied to the source electrode. The electric connection with the drain electrode is controlled to be in the conductive state or the blocking-off state in response to the data holding mode switching signal KP applied to the gate electrode of the control transistor LN1.

The source electrode of the p-channel type MOSFET with the high threshold value of the inverter circuit INV4 is connected with the drain electrode of the control transistor LP1. Also, the source electrode of the n-channel type MOSFET with the lower threshold value of the inverter circuit INV4 is connected with the drain electrode of the control transistor LN1.

The operation of the latch circuit according to the seventeenth embodiment of the present invention shown in FIG. 25 will be described with reference to FIGS. 3A to 3E. The basic operation is identical with that of the latch circuits 10A which is shown in FIG. 13. Therefore, only the operation in relation to the data holding mode switching signal KP and the inverted data holding mode switching signal KPB will be especially described.

First, the operation in case of the active mode will be described in which the sleep mode switching signal SL (SL="0") with the low potential and the inverted sleep mode switching signal SLB (SLB="1") with the high potential are applied.

In the active mode state, the data signal D is taken in by the transfer gate TM1 at the timing of the clock signal φ and the inverted clock signal *φ which are supplied to the transfer gate TM1 and is sent out to the inverter circuit INV1. The inverter circuit INV1 in the active state takes the data signal from the transfer gate TM1 therein and sends out it to the input side of the inverter circuit INV2 and the output side of the inverter circuit INV4.

The inverter circuit INV4 is in the non-active state, as long as the data holding mode switching signal KP (KP="0") with the low potential and the inverted data holding mode switching signal KPB (KPB="1") with the high potential are applied in the active mode. Therefore, the interference and the competition with the data signal sent out from the inverter circuit INV1 can be avoided.

Next, the operation will be described of a period from the time when the operation mode is switched from the active mode (SL="0" and SLB="1") to the sleep mode (SL="1" and SLB="0") to the time when the operation mode is switched from the sleep mode to the active mode through the time of the sleep mode.

In the above-mentioned period, the state in which the data holding mode switching signal KP (KP="1") with the high potential and the inverted data holding mode switching signal KPB (KPB="0") with the low potential are applied is fixed and the inverter circuit INV4 is set to the active state. Because the data signal can be held in the bistable circuit which is composed of the inverter circuit INV4 and the inverter circuit INV2, the internal state of the latch circuit is never destroyed.

Figure 26:
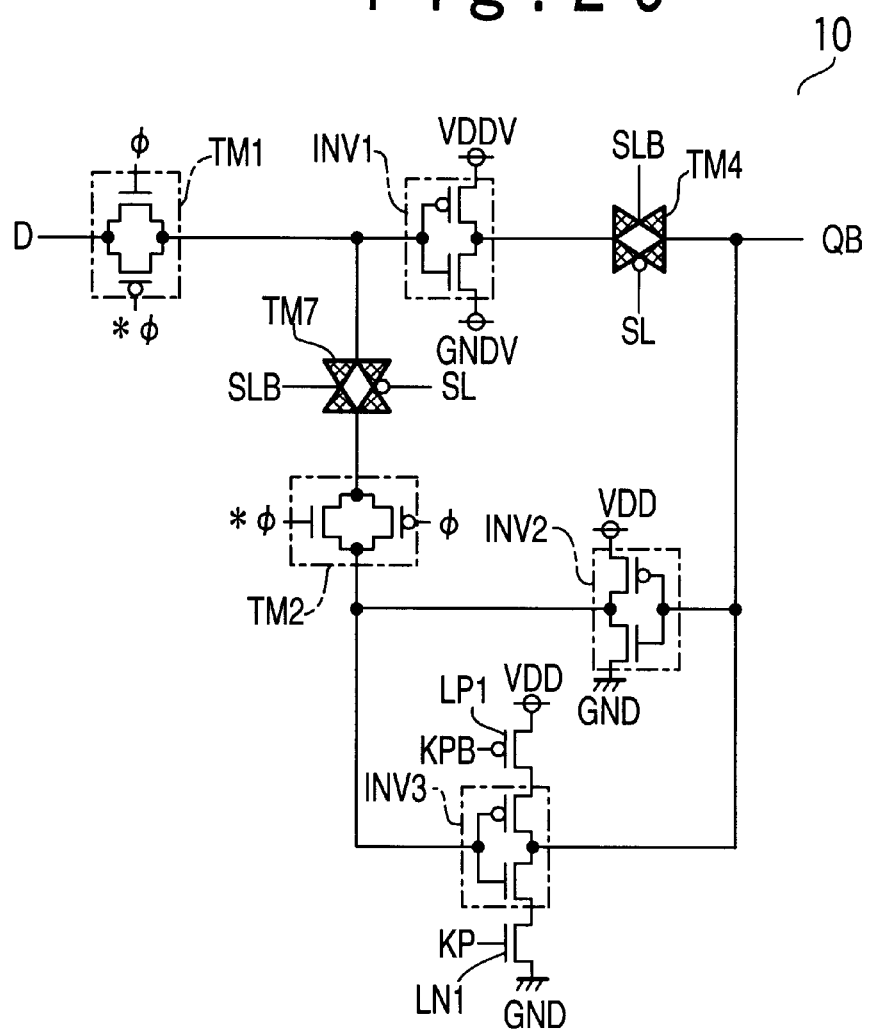
FIG. 26 is a circuit diagram illustrating the structure of the sequential circuit according to the eighteenth embodiment of the present invention.
Figure 27:
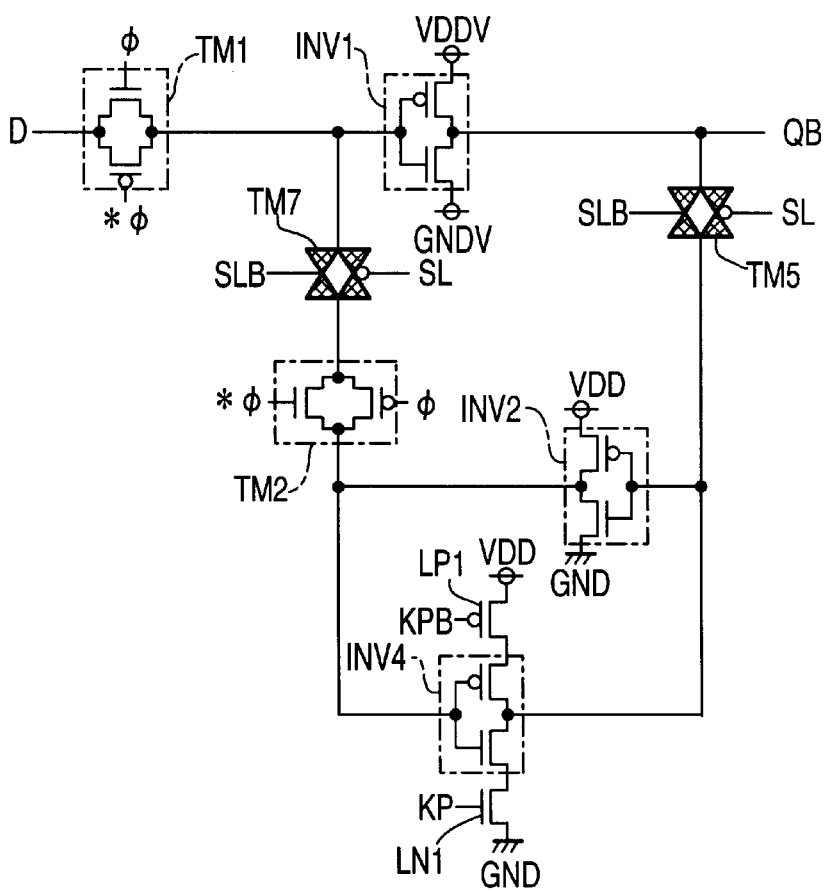
FIG. 27 is a circuit diagram illustrating the structure of a modification of the sequential circuit according to the eighteenth embodiment of the present invention.

Next, the semiconductor integrated logic circuit with the latch circuits as the sequential circuit which has the information holding function at the time of the sleep mode according to the eighteenth embodiment of the present invention will be described. FIG. 26 is a circuit diagram illustrating the structure of the latch circuit as the sequential circuit according to the eighteenth embodiment of the present invention. FIG. 27 is a circuit diagram illustrating the structure of a modification of the latch circuit as the sequential circuit according to the eighteenth embodiment of the present invention.

The latch circuits according to the eighteenth embodiment of the present invention shown in FIG. 26 or FIG. 27 is a modification example of the latch circuit shown in FIG. 25 and has the same structure as the latch circuit shown in FIG. 25. The latch circuits according to the eighteenth embodiment is different from the latch circuit shown in FIG. 25 in the following points. That is, the voltage supply is directly performed from the high-voltage source and the low voltage source to the inverter circuit INV1. Also, the transfer gate TM4 is composed of transistors with the high threshold value and is connected immediately behind the inverter circuit INV1.

Figure 28:
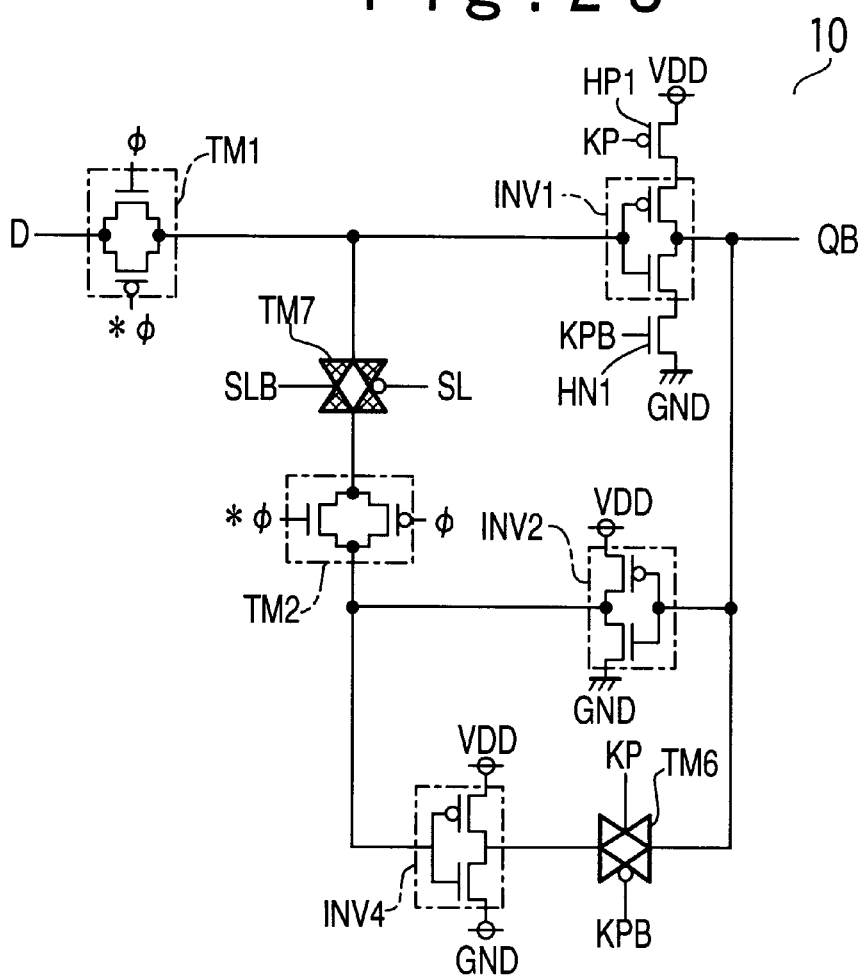
FIG. 28 is a circuit diagram illustrating the structure of the sequential circuit according to the nineteenth embodiment of the present invention.

Next, the semiconductor integrated logic circuit with the latch circuit as the sequential circuit which has the information holding function at the time of the sleep mode according to the nineteenth embodiment of the present invention will be described below. FIG. 28 is a circuit diagram illustrating the structure of the latch circuit as the sequential circuit according to the nineteenth embodiment of the present invention.

Referring to FIG. 28, the latch circuit according to the nineteenth embodiment of the present invention has the same structure as that of the latch circuit shown in FIG. 25.

The latch circuit according to the nineteenth embodiment is different from the latch circuit shown in FIG. 25 in the following points. That is, the power supply is directly performed from the higher potential side actual power supply line VDD and the lower potential side actual power supply line GND to the inverter circuit INV4 of the latch circuit. Also, the transfer gate TM6 is composed of transistors with the high threshold values and is connected immediately behind the inverter circuit INV4.

The signal which controls the opening and closing operation of the transfer gate TM6 is synchronizes with the data holding mode switching signal KP and the inverted data holding mode switching signal KPB which is the inverted signal of the data holding mode switching signal KP. That is, the data holding mode switching signal KP (KP="1") with the high potential and the inverted data holding mode switching signal KPB (KPB="0") are applied to the transfer gate TM6 to set the transfer gate TM6 to the conductive state. Also, the data holding mode switching signal KP (KP="0") with the low potential and the inverted data holding mode switching signal KPB (KPB="1") with the high potential are applied to the transfer gate TM6 to set the transfer gate TM6 to the non-conductive state.

The operation of the latch circuit according to the nineteenth embodiment of the present invention shown in FIG. 28 will be described with reference to FIGS. 3A to 3E. The basic operation is identical with that of the latch circuit shown in FIG. 24. Therefore, only the operation in relation to data holding mode switching signal KP and the inverted data holding mode switching signal KPB will be especially described.

First, the operation in case of the active mode will be described in which the sleep mode switching signal SL (SL="0") with the low potential and the inverted sleep mode switching signal SLB (SLB="1") with the high potential are applied.

In the active mode, the data signal D passes through the transfer gate TM3 in the conductive state in the active mode, and is taken in by the transfer gate TM1 at the timing of the clock signal φ and the inverted clock signal *φ which are supplied to the transfer gate TM1 and then is sent out to the inverter circuit INV1. The inverter circuit INV1 in the active state takes the data signal from the transfer gate TM1 therein and sends out it to the input side of the inverter circuit INV2 and one of the electrodes of the transfer gate TM6 which has the bidirectional characteristic. In the active mode, because the transfer gate TM6 is in the non-conductive state in this case, as long as the data holding mode switching signal KP (KP="0") with the low potential and the inverted data holding mode switching signal KPB (KPB="1") with the high potential are applied. Therefore, the interference and the competition with the data signal which the inverter circuit INV1 sends out and the data signal which the inverter circuit INV4 sends out can be avoided.

Next, the operation will be described of a period from the time when the operation mode is switched from the active mode (SL="0" and SLB="1") to the sleep mode (SL="1" and SLB="0") to the time when the operation mode is switched from the sleep mode to the active mode through the time of the sleep mode. During the above-mentioned period, the state in which the data holding mode switching signal KP (KP="1") with high potential and the inverted data holding mode switching signal KPB (KPB="0") with the low potential are applied is fixed to set the transfer gate TM6 to the conductive state. Because the data can be held in the bistable circuit which is composed with the inverter circuit INV2, the internal state of the latch circuit is never destroyed.

Figure 29:
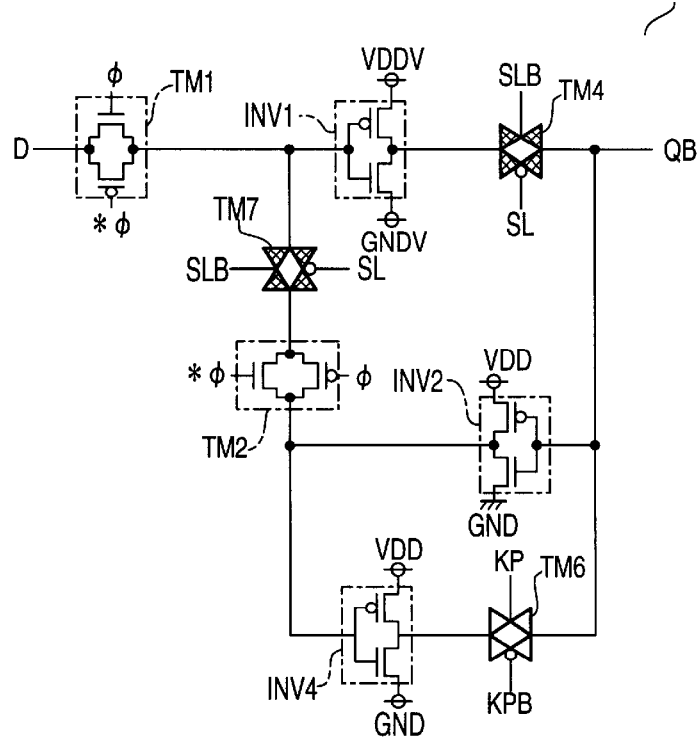
FIG. 29 is a circuit diagram illustrating the structure of the sequential circuit according to the twentieth embodiment of the present invention.
Figure 30:
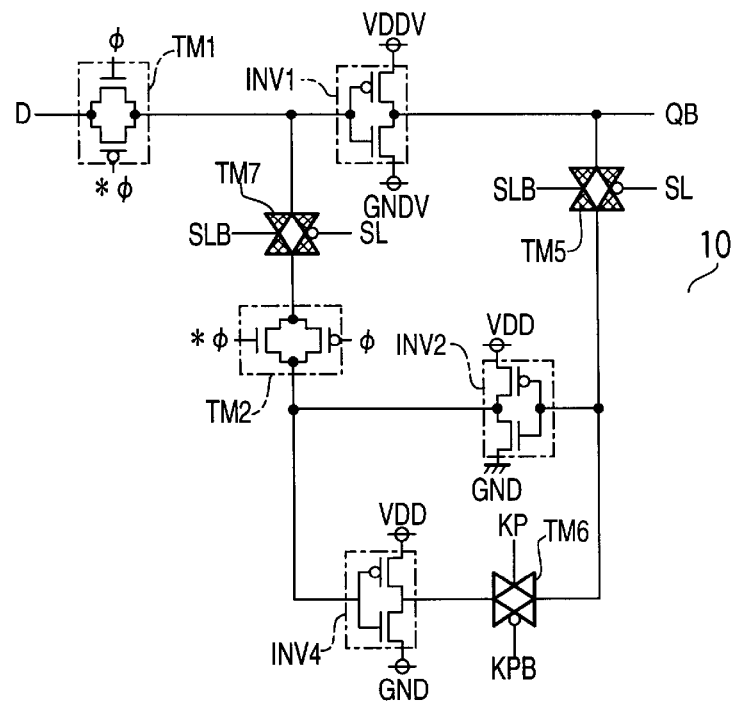
FIG. 30 is a circuit diagram illustrating the structure of a modification of the sequential circuit according to the twentieth embodiment of the present invention.

Next, the semiconductor integrated logic circuit with the latch circuits as the sequential circuit which has the information holding function at the time of the sleep mode according to the twentieth embodiment of the present invention will be described below. FIG. 29 is a circuit diagrams illustrating the structure of the latch circuit as the sequential circuit according to the twentieth embodiment of the present invention. FIG. 30 is a circuit diagrams illustrating the structure of a modification of the latch circuit as the sequential circuit according to the twentieth embodiment of the present invention.

Referring to FIG. 29 and FIG. 30, the latch circuit according to the twentieth embodiment of the present invention shown in FIG. 29 or FIG. 30 is a modification examples of the latch circuit shown in FIG. 28, and has the same structure as the latch circuit shown in FIG. 28. The latch circuit according to the twentieth embodiment is different from the latch circuit shown in FIG. 28 in the following points. That is, the power supply is directly performed from the higher potential side actual power supply line VDD and the lower potential side actual power supply line GND to the inverter circuit INV1 of the latch circuit shown in FIG. 28. Also, the transfer gate TM4 is composed of transistors with the high threshold value and is connected on the output side of the inverter circuit INV1. Also, the transfer gate TM4 is composed of transistors with the high threshold value and is connected between the output side of the inverter circuit INV1 and the input side of the inverter circuit INV2.

As described above, the following can be said in the present invention.

For example, it supposes that the clock signals are fixed to the states in which the clock signal φ (φ="0") with a low potential and the inverted clock signal *φ (*φ="1") with a high potential are applied, the output of the inverter circuit INV2A of the latch circuit 10A is in the state of "1" (therefore, the output of the inverter circuit INV3A is in the state of "0"), the output of the inverter circuit INV2B of the latch circuit 10B is in the state of "0" (therefore, the output of the inverter circuit INV3B is in the state of "1"), and an operation mode is switched to the sleep mode (SL="1" and SLB="0"). In this case, in the semiconductor integrated logic circuit according to the conventional example shown in FIG. 1, the DC current due to the sub-threshold leakage current flows along the route shown by the thick arrow lines in FIG. 1 from the higher potential side actual power supply VDD to the lower potential side actual power supply GND. On the other hand, In case of the above-mentioned state in the semiconductor integrated logic circuit according to the present invention shown in FIG. 2, the inverter circuit INV2A with the input state of "0" and the output state of "1" can be a supply source of the leakage current. The leakage current can pass through the transfer gate TM2A in the conductive state and pass through the transfer gate TM1A which has a large sub-threshold leakage current because it is composed of the lower threshold type transistor although it is in the non-conductive state.

However, in the semiconductor integrated logic circuit according to the present invention shown in FIG. 2, this leakage current is prevented by the transfer gate TM3A which do not have a sub-threshold leakage current because it is composed of the higher threshold type transistors in the non-conductive state. Therefore, the leakage current never flows from the latch circuits 10A to the logic circuit section.

Also, in FIG. 2, the inverter circuit INV2B in the input state of "1" and in the output state of "0" can be the demand source of the leakage current, and the leakage current can pass through the transfer gate TM2B in the conductive state and pass through the transfer gate TM1B which has a large sub-threshold leakage because it is composed of the lower threshold type transistor although it is in the non-conductive state.

However, this leakage current is prevented by the transfer gate TM3B where there is not a sub-threshold leakage current because it is composed of the higher threshold type transistor in the non-conductive state. Therefore, the leakage current never flows from the logic circuit section into the latch circuit 10B.

As described above, in the present invention, when two or more latch circuits 10A and 10B exist in the semiconductor integrated logic circuit, the increase of the power consumption by the sub-threshold leakage current never occurs through the control transistors which are composed of p- and n-channel type MOSFETs with high threshold values, i.e. the control transistors HP1I and HN1I and through the logic circuit section (INV1I, INV2I, and so on) to which power is supplied from the higher potential side actual power supply and the lower potential side actual power supply.

It should be noted that the present invention is not limited to the above structure. For example, the first inverter circuit section (INV2, INV3, INV4 and so on) in a data holding section contains the inverter circuits (INV3, INV4 and so on) to which a power supply voltage is supplied from the higher potential side actual power supply line VDD and the lower potential side actual power supply line GND based on the data holding mode switching signal KP and the inverted data holding mode signal KPB, and may has the function to avoid interference and competition with the data signal which the second inverter circuit section (INV1A, INV1I, INV1B, and so on) sends out.

Also, the first inverter circuit section in the data holding section contains the inverter circuit (INV3, INV4 and so on) that the power supply voltage is directly supplied from the higher potential side actual power supply line VDD and the lower potential side actual power supply line GND. Also, the data holding section has the transfer gates (TM6, TM8 and so on) immediately later on the output side of the inverter circuit (INV3, INV4 and so on). The transfer gate (TM6, TM8 and so on) operates based on the data holding mode switching signal KP and the inverted data holding mode switching signal KPB. In this way, the interference and competition with the data signal which the second inverter circuit section sends out may be avoided. Also, the transfer gate may be driven in synchronous with the sleep mode switching signal SL and the inverted switching the sleep mode signal SLB obtained by inverting the sleep mode switching signal SL.

Moreover, the transfer gate may be composed of a combination of transistors with high threshold values different in the conductive type and may have a bidirectional gate characteristic.

Moreover, the first or second switching element section may be composed of a single transistor with a high threshold value as shown in FIG. 5, and may have a unidirectional gate characteristic.

Moreover, the transfer gate may be composed of a n-channel type MOSFET with the high threshold value which is controlled based on the inverted sleep mode switching signal, and a signal voltage used to set the transfer gate section to the conductive state in response to the inverted sleep mode switching signal may be set to be equal to the summation of the threshold value voltage of the n-channel type MOSFET with a high threshold value and the higher potential side voltage. Also, the transfer gate may be composed of a p-channel type MOSFET with a high threshold value which is controlled in response to the sleep mode switching signal and the signal voltage of the sleep mode switching signal used to set said switching element section to the conductive state may be set to be equal to the summation of the threshold value voltage of the p-channel type MOSFET with the high threshold value and the higher potential side voltage.

Also, the transfer gate (TM6, TM8 and so on) is composed of the n-channel type MOSFET which is controlled based on the inverted data holding mode switching signal KPB, and the signal voltage of the inverted data holding mode switching signal KPB used to set the switching element section to the conductive state may be set to be equal to the summation of the threshold value voltage of the n-channel type MOSFET and the higher potential side voltage.

Also, the transfer gate t (TM6, TM8 and so on) is composed of a p-channel type MOSFET which is controlled in response to the data holding mode switching signal KP, and the signal voltage of the data holding mode switching signal KP used to set the switching element section to the conductive state may be set to be equal to a summation of the threshold of the p-channel type MOSFET and the higher potential side voltage.

Also, the transfer gate (TM6, TM8 and so on) may be composed of a combination of transistors of different conductive types and may have the bidirectional gate characteristic. Also, the transfer gate (TM6, TM8 and so on) may be composed of a single transistor and may have the unidirectional gate characteristic.

As described above, according to the present invention, the DC current due to the sub-threshold leakage which is generated at the time of the sleep mode is prevented by the switching element which does not have any sub-threshold leakage current because it is composed of the higher threshold type transistor, and it never flows out from the latch circuit to the logic circuit, resulting in reduction of the power consumption.

Also, when two or more latch circuits exist in the semiconductor integrated logic circuit, the power consumption at the time of the sleep mode can be reduced, because it is possible to prevent the flow of the sub-threshold leakage current through the logic circuit.

What is claimed is:

1. A semiconductor integrated logic circuit device with a sequential circuit comprising:

a transferring circuit coupled between first and second nodes, wherein said transferring circuit transfers a data signal from said first node to said second node in response to a clock signal;

an inverting circuit coupled between said second node and a third node, wherein said inverting circuit inverts said data signal on said second node to output on said third node as an inverted data signal;

a bistable circuit connected to said second and third nodes, wherein said bistable circuit holds said data signal; and a blocking circuit coupled between said bistable circuit and said first node, wherein said blocking circuit blocks sub-threshold leakage current.

2. A semiconductor integrated logic circuit device according to claim 1, wherein said blocking circuit comprises a first transfer gate coupled between said first and second nodes and operating in response to an operation mode signal.

3. A semiconductor integrated logic circuit device according to claim 2, wherein said transferring circuit comprises two MOSFETs having a first threshold voltage and coupled to transfer said data signal, and said first transfer gate has a bidirectional transfer characteristic and comprises p-type and n-type MOSFETs having a second threshold voltage higher than said first threshold voltage.

4. A semiconductor integrated logic circuit device according to claim 2, wherein said transferring circuit comprises two MOSFETs having a first threshold voltage and coupled to transfer said data signal, and said first transfer gate comprises a MOSFET having a second threshold voltage higher than said first threshold voltage.

5. A semiconductor integrated logic circuit device according to claim 2, wherein said transferring circuit comprises two MOSFETs having a first threshold voltage and coupled to transfer said data signal, and said bistable circuit comprises:

a first inverter circuit connected to said second node at its input and to said third node at its output;

a second inverter circuit having an input and an output, said second inverter circuit input connected to said third node; and a second transfer gate coupled between said second node and said second inverter circuit output, said second transfer gate transferring said data signal held by said second inverter circuit to said first inverter circuit in response to said clock signal.

6. A semiconductor integrated logic circuit device according to claim 5, wherein each transistor of said first and second inverter circuits comprises a MOSFET with a second threshold voltage higher than said first threshold voltage.

7. A semiconductor integrated logic circuit device according to claim 6, further comprising higher and lower potential side actual power supply lines, and said first and second inverter circuits are connected between said higher and lower potential side actual power supply lines.

8. A semiconductor integrated logic circuit device according to claim 6, further comprising higher and lower potential side actual power supply lines, and said second inverter circuit is selectively connected between said higher and lower potential side actual power supply lines in response to a data holding mode signal.

9. A semiconductor integrated logic circuit device according to claim 5, further comprising higher and lower potential side actual power supply lines, and said inverting circuit comprises a third inverting circuit which is selectively connected to said higher and lower potential side actual power supply lines in response to said operation mode signal.

10. A semiconductor integrated logic circuit device according to claim 5, wherein said inverting circuit comprises a third inverting circuit connected between higher and lower potential side quasi power supply lines, to which a voltage is selectively supplied from higher and lower potential side actual power supply lines in response to said operation mode signal, and said semiconductor integrated logic circuit device further comprises a third transfer gate blocking off said sub-threshold leakage current in response to said operation mode signal.

11. A semiconductor integrated logic circuit device according to claim 10, wherein said third transfer gate is coupled between said inverting circuit and said third node.

12. A semiconductor integrated logic circuit device according to claim 10, wherein said third transfer gate is coupled between said bistable circuit and said third node.

13. A semiconductor integrated logic circuit device according to claim 2, wherein said transferring circuit comprises two MOSFETs having a first threshold voltage and coupled to transfer said data signal, and said bistable circuit comprises:

a second transfer gate connected to said second node, said second transfer gate transferring said data signal in response to said clock signal;

a first inverter circuit connected to said second transfer gate at its output and to said third node at its input; and a second inverter circuit connected to said third node at its output and to said second transfer gate at its output.

14. A semiconductor integrated logic circuit device according to claim 13, wherein each transistor of said first and second inverter circuits comprises a MOSFET with a second threshold voltage higher than said first threshold voltage.

15. A semiconductor integrated logic circuit device according to claim 14, further comprising higher and lower potential side actual power supply lines, and said second inverter circuits are connected between said higher and lower potential side actual power supply lines.

16. A semiconductor integrated logic circuit device according to claim 14, further comprising higher and lower potential side actual power lines, and said second inverter circuit is selectively connected between said higher and lower potential side actual power supply lines in response to a data holding mode signal.

17. A semiconductor integrated logic circuit device according to claim 13, further comprising higher and lower potential side actual power supply lines, and said inverting circuit comprises a third inverting circuit which is selectively connected to said higher and lower potential side actual power supply lines in response to said operation mode signal.

18. A semiconductor integrated logic circuit device according to claim 13, wherein said inverting circuit comprises a third inverting circuit connected between higher and lower potential side quasi power supply lines, to which a voltage is selectively supplied from higher and lower potential side actual power supply lines in response to said operation mode signal, and said semiconductor integrated logic circuit device further comprises a third transfer gate blocking off said sub-threshold leakage current in response to said operation mode signal.

19. A semiconductor integrated logic circuit device according to claim 18, wherein said third transfer gate is coupled between said inverting circuit and said third node.

20. A semiconductor integrated logic circuit device according to claim 18, wherein said third transfer gate is coupled between said bistable circuit and said third node.

21. A semiconductor integrated logic circuit device according to claim 13, wherein said bistable circuit further comprises a fourth transfer gate controlling transfer of said data signal between said first inverter circuit and said second inverter circuit in response to a data holding mode signal.

22. A semiconductor integrated logic circuit device according to claim 1, wherein said semiconductor integrated circuit comprises:

a plurality of said sequential circuits; and a CMOS logic circuit outputting to a plurality of said data signals to said plurality of sequential circuits, respectively.

23. A semiconductor integrated logic circuit device with a sequential circuit comprising:
- a transferring circuit coupled between first and second nodes, wherein said transferring circuit transfers a data signal from said first node to said second node in response to a clock signal;
- an inverting circuit coupled between said second node and a third node, wherein said inverting circuit inverts said data signal on said second node to output on said third node as an inverted data signal;
- a bistable circuit coupled to said second and third nodes, wherein said bistable circuit holds said data signal; and
- a blocking circuit coupled between said bistable circuit and said second node, wherein said blocking circuit blocks sub-threshold leakage current in response to an operation mode signal.

24. A semiconductor integrated logic circuit device according to claim 23, wherein said blocking circuit comprises a first transfer gate coupled between said second node and said bistable circuit.

25. A semiconductor integrated logic circuit device according to claim 24, wherein said transferring circuit comprises two MOSFETs having a first threshold voltage and coupled to transfer said data signal, and
said bistable circuit comprises:
- a first inverter circuit connected to said second node at its input and to said third node at its output;
- a second inverter circuit having an input and an output said second inverter circuit input connected to said third node; and
- a second transfer gate coupled between said second node and said second inverter circuit output, said second transfer gate transferring said data signal held by said second inverter circuit to said first inverter circuit in response to said clock signal.

26. A semiconductor integrated logic circuit device according to claim 25, wherein each transistor of said first and second inverter circuits comprises a MOSFET with a second threshold voltage higher than said first threshold voltage.

27. A semiconductor integrated logic circuit device according to claim 26, further comprising higher and lower potential side actual power supply lines, and
said first and second inverter circuits are connected between said higher and lower potential side actual power supply lines.

28. A semiconductor integrated logic circuit device according to claim 26, further comprising higher and lower potential side actual power supply lines, and
said second inverter circuit is selectively connected between said higher and lower potential side actual power supply lines in response to a data holding mode signal.

29. A semiconductor integrated logic circuit device according to claim 25, further comprising higher and lower potential side actual power supply lines, and
said inverting circuit comprises a third inverting circuit selectively connected to said higher and lower potential side actual power supply lines in response to said operation mode signal.

30. A semiconductor integrated logic circuit device according to claim 25, wherein said inverting circuit comprises a third inverting circuit connected between higher and lower potential side quasi power supply lines, to which a voltage is selectively supplied from higher and lower potential side actual power supply lines in response to said operation mode signal, and
said semiconductor integrated logic circuit device further comprises a third transfer gate blocking off said sub-threshold leakage current in response to said operation mode signal.

31. A semiconductor integrated logic circuit device according to claim 30, wherein said third transfer gate is coupled between said inverting circuit and said third node.

32. A semiconductor integrated logic circuit device according to claim 30, wherein said third transfer gate is coupled between said bistable circuit and said third node.

33. A semiconductor integrated logic circuit device according to claim 22, wherein said transferring circuit comprises two MOSFETs having a first threshold voltage and coupled to transfer said data signal, and
said bistable circuit comprises:
- a second transfer gate connected to said second node, said second transfer gate transferring said data signal in response to said clock signal;
- a first inverter circuit connected to said second transfer gate at its output and to said third node at its input; and
- a second inverter circuit connected to said third node at its output and to said second transfer gate at its output.

34. A semiconductor integrated logic circuit device according to claim 33, wherein each transistor of said first and second inverter circuits comprises a MOSFET with a second threshold voltage higher than said first threshold voltage.

35. A semiconductor integrated logic circuit device according to claim 34, further comprising higher and lower potential side actual power supply lines, and
said first and second inverter circuits are connected between said higher and lower potential side actual power supply lines.

36. A semiconductor integrated logic circuit device according to claim 34, further comprising higher and lower potential side actual power lines, and
said second inverter circuit is selectively connected between said higher and lower potential side actual power supply lines in response to a data holding mode signal.

37. A semiconductor integrated logic circuit device according to claim 33, further comprising higher and lower potential side actual power supply lines, and
said inverting circuit comprises a third inverting circuit which is selectively connected to said higher and lower potential side actual power supply lines in response to said operation mode signal.

38. A semiconductor integrated logic circuit device according to claim 33, wherein said inverting circuit comprises a third inverting circuit connected between higher and lower potential side quasi power supply lines, to which a voltage is selectively supplied from higher and lower potential side actual power supply lines in response to said operation mode signal, and
said semiconductor integrated logic circuit device further comprises a third transfer gate blocking off said sub-threshold leakage current in response to said operation mode signal.

39. A semiconductor integrated logic circuit device according to claim 38, wherein said third transfer gate is coupled between said inverting circuit and said third node.

40. A semiconductor integrated logic circuit device according to claim 38, wherein said third transfer gate is coupled between said bistable circuit and said third node.

41. A semiconductor integrated logic circuit device according to claim 33, wherein said bistable circuit further comprises a fourth transfer gate controlling transfer of said data signal between said first inverter circuit and said second inverter circuit in response to a data holding mode signal.

42. A semiconductor integrated logic circuit device according to claim 24, wherein said transferring circuit comprises two MOSFETs having a first threshold voltage and coupled to transfer said data signal, and said first transfer gate has a bidirectional transfer characteristic and comprises p-type and n-type MOSFETs having a second threshold voltage higher than said first threshold voltage and operating in response to said operation mode signal.

43. A semiconductor integrated logic circuit device according to claim 24, wherein said transferring circuit comprises two MOSFETs having a first threshold voltage and coupled to transfer said data signal, and said first transfer gate comprises a MOSFET having a second threshold voltage higher than said first threshold voltage.

* * * * *

UNITED STATES PATENT AND TRADEMARK OFFICE
CERTIFICATE OF CORRECTION

PATENT NO. : 6,246,265 B1
DATED : June 12, 2001
INVENTOR(S) : Tadahiko Ogawa

It is certified that error appears in the above-identified patent and that said Letters Patent is hereby corrected as shown below:

Column 29,
Line 32, delete "SLBn" insert -- SLB --;
Line 36, delete "ling" insert -- line --

Signed and Sealed this

Eighteenth Day of June, 2002

Attest:

Attesting Officer

JAMES E. ROGAN
Director of the United States Patent and Trademark Office